US012586652B2

(12) United States Patent
Payak et al.

(10) Patent No.: US 12,586,652 B2
(45) Date of Patent: Mar. 24, 2026

(54) ESTIMATING PEAK SOURCE CURRENT USING MEMORY DIE SUBSTRATE TEMPERATURE DETECTION

(71) Applicant: Sandisk Technologies, Inc., Milpitas, CA (US)

(72) Inventors: Keyur Payak, Santa Clara, CA (US); Khin Htoo, Danville, CA (US); Primit Modi, Fremont, CA (US); Tushar Negi, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 211 days.

(21) Appl. No.: 18/358,763

(22) Filed: Jul. 25, 2023

(65) Prior Publication Data

US 2024/0404605 A1     Dec. 5, 2024

Related U.S. Application Data

(60) Provisional application No. 63/504,985, filed on May 30, 2023.

(51) Int. Cl.
| | |
|---|---|
| *G11C 16/26* | (2006.01) |
| *G01K 1/14* | (2021.01) |
| *G11C 16/04* | (2006.01) |
| *G11C 16/30* | (2006.01) |

(52) U.S. Cl.
CPC ................ G11C 16/30 (2013.01); G01K 1/14 (2013.01); G11C 16/0483 (2013.01); G11C 16/26 (2013.01)

(58) Field of Classification Search
CPC ..... G11C 16/30; G11C 16/0483; G11C 16/26; G01K 1/14
See application file for complete search history.

(56) References Cited

U.S. PATENT DOCUMENTS

| | | | | |
|---|---|---|---|---|
| 11,270,776 | B1 * | 3/2022 | Lien ...................... | G11C 16/24 |
| 2021/0375371 | A1 * | 12/2021 | Lien ................... | G11C 16/0483 |
| 2024/0071493 | A1 * | 2/2024 | Zainuddin ............. | G06F 3/0653 |
| 2024/0194273 | A1 * | 6/2024 | Yoon ....................... | G06F 1/206 |
| 2024/0257878 | A1 * | 8/2024 | Zainuddin .............. | G11C 16/30 |

* cited by examiner

*Primary Examiner* — Min Huang
(74) *Attorney, Agent, or Firm* — Pearl Cohen Zedek Latzer Baratz LLP

(57)     ABSTRACT

Embodiments of the present technology provide a memory die that estimates ICC peak using cost effective (and small area) on-memory die components and processing circuitry. The memory die leverages a temperature sensor to estimate a temperature rise for a substrate region of the memory die located proximate to a wordline ramp up pump during a wordline ramp up process performed before a read operation. Based on the estimated temperature rise for the substrate region, the memory die can determine that an ICC peak of the memory die deviates from a target ICC peak value—and adjust parameters of the wordline ramp up process in a manner that brings the ICC peak of the memory die closer to the target ICC peak value.

20 Claims, 19 Drawing Sheets

900

ESTIMATE, DURING A WORDLINE RAMP UP PROCESS, A TEMPERATURE RISE FOR A SUBSTRATE REGION OF A MEMORY DIE LOCATED PROXIMATE TO A WORDLINE RAMP UP PUMP

902

DETERMINE THAT AN ICC PEAK OF THE MEMORY DIE DEVIATES FROM A TARGET ICC PEAK VALUE BASED ON THE ESTIMATED TEMPERATURE RISE

904

ADJUST PARAMETERS OF THE WORDLINE RAMP UP PROCESS BASED ON THE DETERMINATION

906

ESTIMATING PEAK SOURCE CURRENT USING MEMORY DIE SUBSTRATE TEMPERATURE DETECTION

CROSS REFERENCE TO RELATED APPLICATIONS

This application claims the benefit of and priority to U.S. Provisional Patent Application No. 63/504,985, filed on May 30, 2023, the contents of which are incorporated herein by reference in their entirety.

DESCRIPTION OF RELATED ART

A supply voltage (referred to herein as VCC) for a memory die can power the various components (e.g., memory cells, read and write circuitry and components, etc.) of the memory die. Current drawn from the VCC may be referred to as a supply current (referred to herein as ICC) of the memory die.

A peak supply current (referred to herein as ICC peak) for a memory die can be an important metric for improving memory die performance. For example, achieving a target ICC peak can reduce time for performing read and programming operations.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
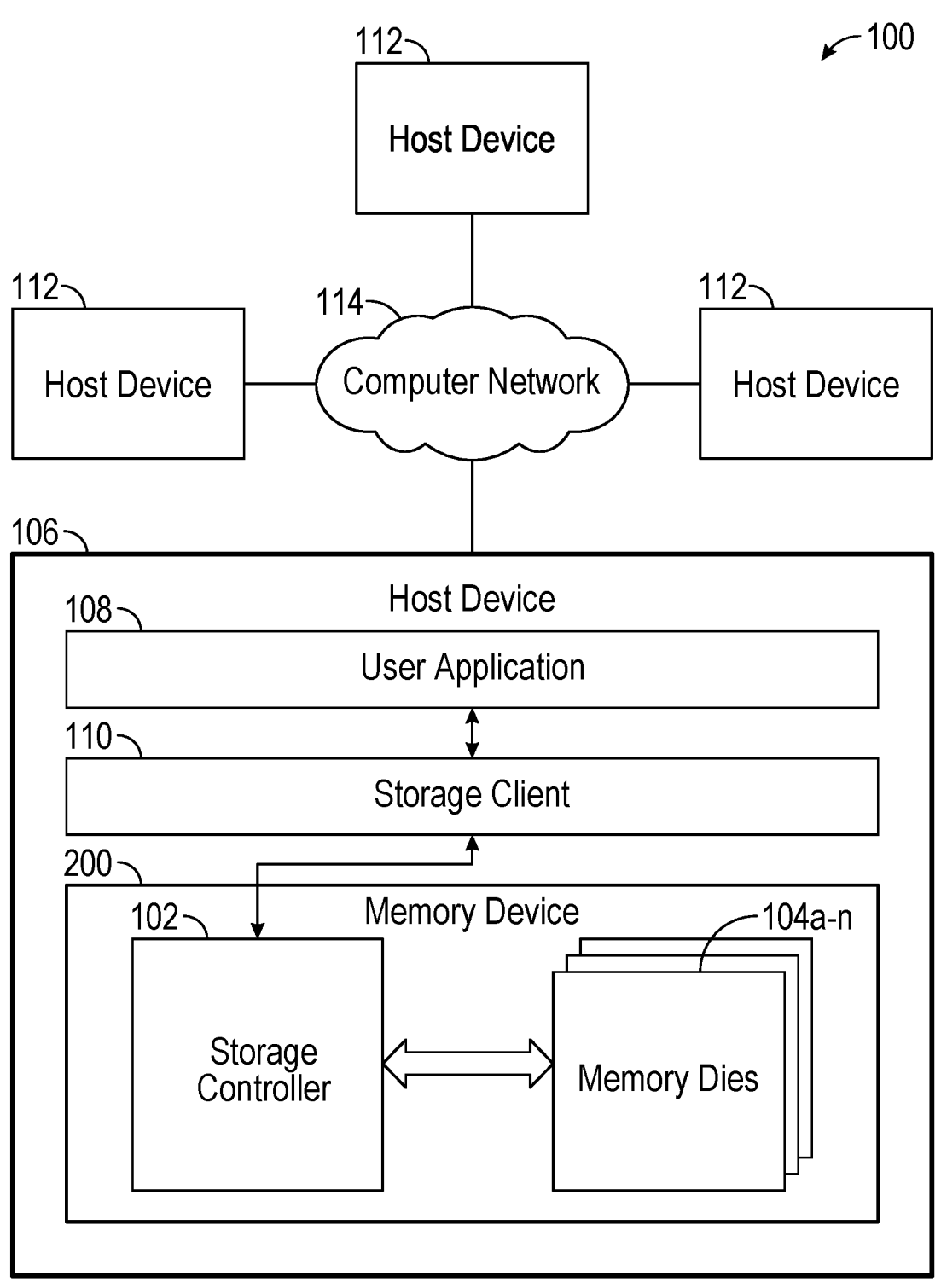
FIG. 1 is a block diagram of an example memory system, in connection with which, example embodiments of the disclosed technology can be implemented.

The figures are not exhaustive and do not limit the present disclosure to the precise form disclosed.

DETAILED DESCRIPTION

As alluded to above, a peak supply current (referred to herein as ICC peak) for a memory die can be an important metric for improving memory die performance. For example, achieving a target ICC peak can reduce time for performing read and programming operations.

In general, a target ICC peak can be achieved by appropriately adjusting operational parameters of a memory die. However, such adjustment generally requires knowledge of a relationship between an existing ICC peak (given existing operational parameters) and the target ICC peak (e.g., is the existing ICC peak higher or lower than the target ICC peak).

Conventional techniques for measuring ICC peaks for memory dies are highly manual and inefficient. For example, inductor components generally required to measure electrical current directly come with a large area penalty. Accordingly, it is expensive—and largely infeasible—to implement such electrical current measuring components on a memory die. While external devices can be used to measure ICC peak (and ICC more generally), this measuring process is highly manual and time/resource intensive. For this reason, memory die vendors typically only test/measure ICC peak for a small subset of memory dies they produce—and make design/parameter adjustments to a larger population of memory dies based on this limited sampling. This approach can be sub-optimal because ICC peak will often vary from memory die-to-memory die based on a number of factors including word line resistance and capacitance, resistor variation, pitch of oxide-nitride (ON) layers of the memory die, metal capacitance/resistance, etc. Unable to test/measure ICC peak for memory dies at a mass scale, it can be difficult for vendors to ensure that all the memory dies they produce achieve a target ICC peak. Mass data collection related to ICC peak is similarly infeasible, making it more difficult for vendors to improve memory die design and parameters to achieve a target ICC peak with greater consistency. Relatedly, because external lab testing equipment is conventionally required for measuring ICC peak, once a memory die leaves a vendor's possession (e.g., once the memory die is out in the field with a customer), ICC peak for the memory die generally cannot/will not be tested. Again, without being able to measure ICC peak for the memory die, it can be difficult/impossible to determine how to adjust operational parameters of the memory die appropriately to achieve a target ICC peak value.

For at least the reasons stated above, improved methodologies for measuring ICC peak for individual memory dies would be highly desirable.

Against this backdrop, embodiments of the present technology provide a memory die (and associated method) that estimates ICC peak using cost effective and small area on-memory die components and processing circuitry. Namely, the memory die leverages a temperature sensor (which is generally smaller and less expensive than inductor components required for direct measurement of electrical currents) to estimate a temperature rise for a substrate region of the memory die located proximate to a wordline ramp up pump during a wordline ramp up process performed before a read operation. Based on the estimated temperature rise for the substrate region, the memory die can determine that an ICC peak of the memory die deviates from a target ICC peak value—and adjust parameters of the wordline ramp up process in a manner that brings the ICC peak of the memory die closer to the target ICC peak value. For example, in response to determining that the ICC peak exceeds the target ICC peak value, the memory die can reduce a ramp up rate of the wordline ramp up pump—thereby reducing the ICC peak for the memory die. Conversely, in response to determining that the ICC peak is less than the target ICC peak value, the memory die can increase the ramp up rate of the wordline ramp up pump—thereby increasing the ICC peak for the memory die.

In practicing the above-described methodology, embodiments of the present technology intelligently leverage a couple important insights. First, in many cases the (overall) ICC peak for a memory die will be the maximum ICC drawn/consumed by a wordline ramp up pump during a wordline ramp up process performed before a read operation. Moreover, even when an actual ICC peak for a memory die is drawn/consumed during a different process (e.g., during a read operation involving a large number of conducting memory cells), the maximum ICC value drawn/consumed by a wordline ramp up pump during the wordline ramp up process will serve as a close approximation of the actual ICC peak. Second, as embodiments are designed in appreciation of, temperature rise of a substrate region located proximate to the wordline ramp up pump can closely correlate with a rise in the ICC drawn/consumed by the wordline ramp up pump during the wordline ramp up process. Embodiments leverage these insights to effectively estimate ICC peak for the memory die based on the temperature rise for the substrate region during the wordline ramp up process.

By enabling on-memory die ICC peak estimation in a cost-effective and efficient manner, embodiments facilitate on-memory die adjustment of operational parameters to achieve a target ICC peak value. In other words, embodiments enable individual memory dies to: (1) self-estimate ICC peak; and (2) self-adjust operational parameters such that they achieve target ICC peak values—thereby improving performance for the individual memory dies. Relatedly, memory die vendors can leverage embodiments to facilitate mass scale ICC peak-related data collection—making it easy for such vendors to make informed design and parameter adjustments to achieve the target ICC peak with greater consistency.

Embodiments of the present technology will be described in greater detail with the following FIGs.

FIGS. 1 to 4H depict an example memory system that can be used to implement the technology disclosed herein. Of course, this is just an example implementation and the disclosed technology is not limited to implementing the present memory cards in a memory system. FIG. 1 is a schematic block diagram illustrating a memory system 100. The memory system 100 includes a memory device 200 (also referred to herein as a storage device), a host device 106, at least one host device 112, and a computer network 114.

The host device 106 may be a computing device (e.g., laptop, desktop, smartphone, tablet, digital camera, wearable smart device, and so on) that includes one or more processors and readable storage devices (such as, but not limited to, RAM, ROM, flash memory, hard disk drive, solid state memory) that store processor readable code (also referred to herein as instructions or software) for programming storage controller 102 to perform the methods described herein. The host device 106 may also include additional system memory, one or more input/output interfaces, and/or one or more input/output devices in communication with the one or more processors, as well as other components well known in the art.

The memory system 100 includes at least one memory device 200, comprising the storage controller 102 and a plurality of memory dies 104. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

In some embodiments, the memory system 100 may include two or more memory devices. Each memory device 200 may include a plurality of memory dies 104, such as flash memory, nano random access memory ("nano RAM or NRAM"), magneto-resistive RAM ("MRAM"), dynamic RAM ("DRAM"), phase change RAM ("PRAM"), etc. The data memory device 200 may also include other types of non-volatile and/or volatile data storage, such as dynamic RAM ("DRAM"), static RAM ("SRAM"), magnetic data storage, optical data storage, and/or other data storage technologies.

The memory device 200 may be a component within a host device 106 as depicted in FIG. 1, and may be connected using a system bus, such as a peripheral component interconnect express ("PCI-e") bus, a Serial Advanced Technology Attachment ("serial ATA") bus, or the like. In another embodiment, the memory device 200 may be external to the host device 106 and is connected via a wired connection, such as, but not limited to, a universal serial bus ("USB") connection, an Institute of Electrical and Electronics Engineers ("IEEE") 1394 bus ("FireWire"), or the like. In other embodiments, the memory device 200 may be connected to the host device 106 using a peripheral component interconnect ("PCI") express bus using external electrical or optical bus extension or bus networking solution such as Infiniband or PCI Express Advanced Switching ("PCIe-AS"), or the like.

In various embodiments, the memory device 200 may be in the form of a dual-inline memory die ("DIMM"), a daughter card, or a micro-module. In another embodiment, the memory device 200 may be a component within a rack-mounted blade. In another embodiment, the memory device 200 may be contained within a package that is integrated directly onto a higher level assembly (e.g., mother-board, laptop, graphics processor, etc.). In another embodiment, individual components comprising the memory device 200 may be integrated directly onto a higher level assembly without intermediate packaging.

In some embodiments, instead of directly connected to the host device 106 via a wired connection, the data memory device 200 may be connected to the host device 106 over a wireless connection. For example, the data memory device 200 may include a storage area network ("SAN") storage device, a network attached storage ("NAS") device, a network share, or the like. In some embodiments, the memory system 100 may be connected to the host via a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host device 106 and the data memory device 200.

The memory system 100 includes at least one host device 106 connected to the memory device 200. Multiple host devices may be used and may comprise a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. "Computer" refers to any computing device. Examples of a computer include, but are not limited to, a personal computer, a laptop, a tablet, a desktop, a server, a main frame, a supercomputer, a computing node, a virtual computer, a hand held device, a smart phone, a cell phone, a system on a chip, a single chip computer, and the like. In another embodiment, a host device 106 may be a client and the memory device 200 may operate autonomously to service data requests sent from the host device 106. In this embodiment, the host device 106 and memory device 200 may be connected using a computer network, system bus, DAS or other communication means suitable for connection between a computer and an autonomous memory device 200.

The illustrative example shown in FIG. 1, the memory system 100 includes a user application 108 in communication with a storage client 110 as part of the host device 106. "Application" refers to any software that is executed on a device above a level of the operating system. An application will typically be loaded by the operating system for execution and will make function calls to the operating system for lower-level services. An application often has a user interface, but this is not always the case. Therefore, the term 'application' includes background processes that execute at a higher level than the operating system.

"Operating system" refers to logic, typically software, that supports a device's basic functions, such as scheduling tasks, managing files, executing applications, and interacting with peripheral devices. In normal parlance, an application is said to execute "above" the operating system, meaning that the operating system is necessary in order to load and execute the application and the application relies on modules of the operating system in most cases, not vice-versa. The operating system also typically intermediates between applications and drivers. Drivers are said to execute "below" the operating system because they intermediate between the operating system and hardware components or peripheral devices.

In various embodiments, the user application 108 may be a software application operating on or in conjunction with the storage client 110. The storage client 110 manages files and data and utilizes the functions and features of the storage controller 102 and associated memory dies 104. "File" refers to a unitary data structure for storing, retrieving, and communicating data and/or instructions. A file is distinguished from other types of packaging by having associated management metadata utilized by the operating system to identify, characterize, and access the file. Representative examples of storage clients include, but are not limited to, a server, a file system, an operating system, a database management system ("DBMS"), a volume manager, and the like. The storage client 110 may be in communication with the storage controller 102 within the memory device 200.

In various embodiments, the memory system 100 may include one or more clients connected to one or more host device 112 through one or more computer networks 114. A host device 112 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 114 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 114 may also include a network from the IEEE 802 family of network technologies, such Ethernet, token ring, Wi-Fi, WiMax, and the like.

The computer network 114 may include servers, switches, routers, cabling, radios, and other equipment used to facilitate networking the host device 106 or host devices and host devices 112 or clients. In some embodiments, the memory system 100 may include one or more host devices 112 and host device 106 that communicate as peers over a computer network 114. In other embodiments, the memory system 100 may include multiple memory devices 200 that communicate as peers over a computer network 114. One of skill in the art will recognize other computer networks comprising one or more computer networks and related equipment with single or redundant connection(s) between one or more clients or other computer with one or more memory devices 200 or one or more memory devices 200 connected to one or more host devices. In one embodiment, the memory system 100 may include two or more memory devices 200 connected through the computer network 114 to a host device 112 without a host device 106.

In some embodiments, the storage client 110 communicates with the storage controller 102 through a host device interface comprising an Input/Output (I/O) interface. "Interface" refers to a protocol and associated circuits, circuitry, components, devices, systems, sub-systems, and the like that enable one device, component, or apparatus to interact and/or communicate with another device, component, or apparatus. For example, the memory device 200 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. A sector of data is typically 512 bytes, corresponding to the size of a sector in magnetic disk drives.

In various embodiments number of sectors form a block (or data block), anywhere from 8 sectors, which is 4 KB, for example, up to 32, 64, 128 or more sectors. Different sized blocks and sectors can also be used. In certain storage systems, such as those interfacing with the Windows® operating systems, the data blocks may be referred to as clusters. In other storage systems, such as those interfacing with UNIX, Linux, or similar operating systems, the data blocks may be referred to simply as blocks. A block or data block or cluster represents a smallest physical amount of storage space on the storage media that is managed by a storage manager, such as a storage controller, storage system, storage unit, storage device, or the like.

In some embodiments, the storage controller 102 may be configured to store data on one or more asymmetric, write-once storage media, such as solid-state storage memory cells within the memory die(s) 104. As used herein, a "write once" storage media refers to storage media that is reinitialized (e.g., erased) each time new data is written or programmed thereon. As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media).

Management of a data block by a storage manager may include specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition. In conventional block storage devices, a logical address, also referred to as a logical block address (LBA), maps directly to a particular data block on physical storage media. In conventional block storage devices, each data block maps to a particular set of physical sectors on the physical storage media.

However, certain storage devices need not directly or necessarily associate logical addresses with particular physical data blocks. These storage devices may emulate a conventional block storage interface to maintain compatibility with a block storage client 110.

In some embodiments, the storage controller 102 may provide a block I/O emulation layer, which serves as a block device interface, or API. In these embodiments, the storage client 110 communicates with the storage device through this block device interface. The block I/O emulation layer may receive commands and logical addresses from the storage client 110 in accordance with this block device interface. As a result, the block I/O emulation layer may provide the storage device compatibility with a block storage client 110.

In some embodiments, a storage client 110 communicates with the storage controller 102 through a host device interface comprising a direct interface. In these embodiments, the memory device 200 directly exchanges information specific to non-volatile storage devices. Memory device 200 using direct interface may store data in the memory die(s) 104 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die(s) 104.

The storage controller 102 may receive a logical address and a command from the storage client 110 and perform the corresponding operation in relation to the memory die(s) 104. The storage controller 102 may support block I/O emulation, a direct interface, or both.

Figure 2A:
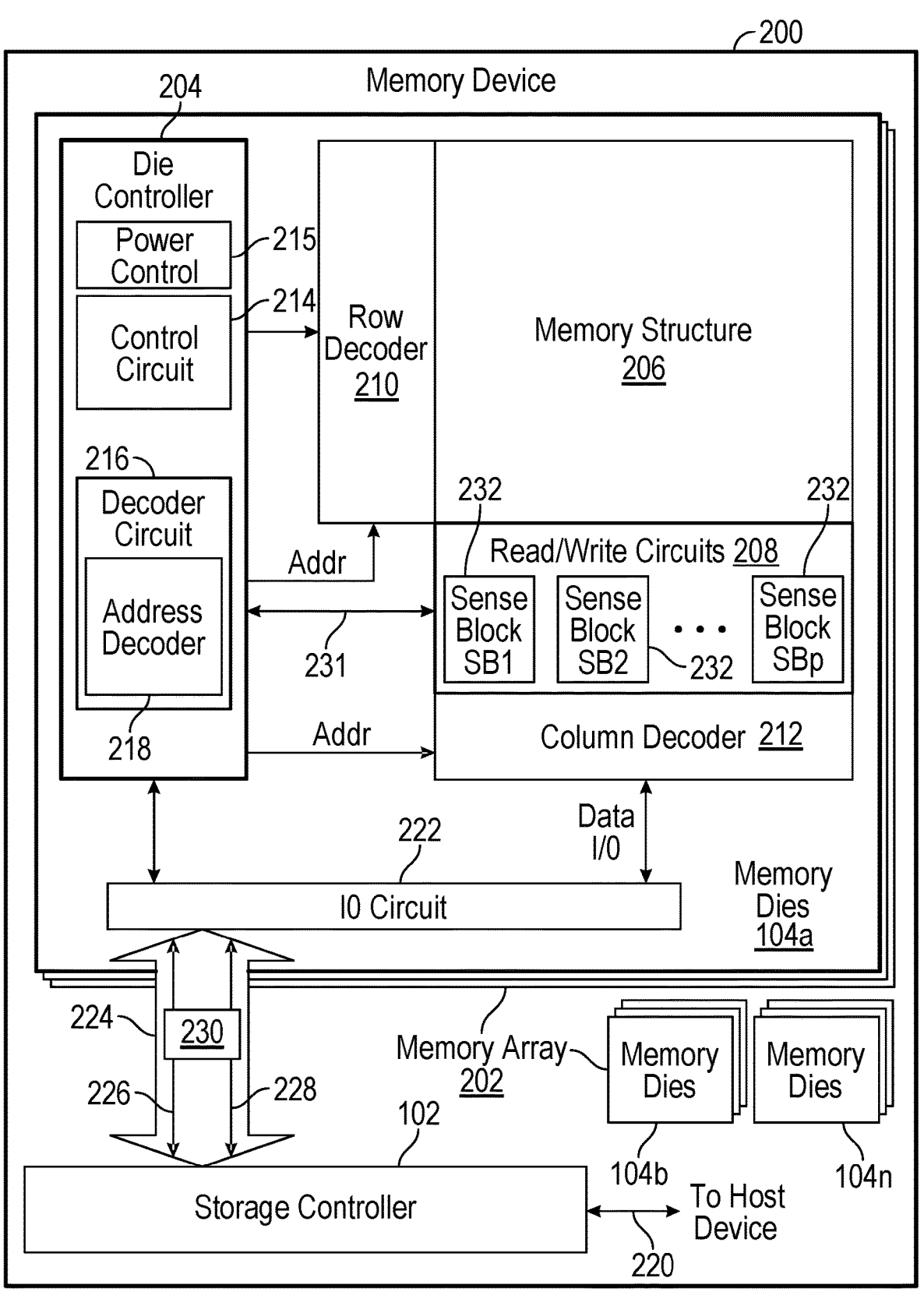
FIG. 2A is a block diagram of an example memory device, in connection with which, example embodiments of the disclosed technology can be implemented.

FIG. 2A is a functional block diagram of an example memory device 200. The components depicted in FIG. 2A are electrical circuits.

The memory device 200 may include a storage controller 102 and a memory array 202 comprised of a number of memory dies 104*a-n*, the storage controller 102 and memory dies 104*a-n* being effectively as described with regard to FIG. 1. Each memory die 104*a-n* can be a complete memory die or a partial memory die and may include a die controller 204, at least one memory structure 206, and read/write circuits 208. The following description will be made with reference to memory die 104*a* as an example of memory dies 104*a-n*, where each memory die may include same or similar components and function in the same or similar way. Thus, while reference herein is made to memory die 104*a*, the same description may be applied equally to memory dies 104*b-n*.

In this context, "memory array" refers to a set of memory cells (also referred to as storage cells) organized into an array structure having rows and columns. A memory array is addressable using a row identifier and a column identifier, each represented as part of an address, such as a column or row address. A non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

In the context of FIG. 2A, memory structure 206 may be addressable by wordlines via a row decoder 210 and by bitlines via a column decoder 212. The read/write circuits 208 include multiple sense blocks 232 including SB1, SB2, . . . , SBp (sensing circuitry) and allow a pages of memory cells to be read or programmed in parallel. Also, many strings of memory cells can be erased in parallel.

"Circuitry", as used herein, refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

A physical page may include memory cells along a row of the memory array for a single plane or for a single memory die. In some embodiments, each memory die 104a-n includes a memory array made up of two equal sized planes. A plane is a division of the memory array that permits certain storage operations to be performed on both places using certain physical row addresses and certain physical column addresses. In one embodiment, a physical page of one plane of a memory die includes four data blocks (e.g., 16 KB). In one embodiment, a physical page (also called a "die page") of a memory die includes two planes each having four data blocks (e.g., 32 KB).

The memory structure 206 can be two-dimensional (2D—laid out in a single fabrication plane) or three-dimensional (3D—laid out in multiple fabrication planes). The non-volatile memory array 202 may comprise one or more arrays of memory cells including a 3D array. In one embodiment, the non-volatile memory array 202 may comprise a monolithic three-dimensional memory structure (3D array) in which multiple memory levels are formed above (and not in) a single substrate, such as a wafer, with no intervening substrates. The non-volatile memory array 202 may comprise any type of non-volatile memory that is monolithically formed in one or more physical levels of arrays of memory cells having an active area disposed above a silicon substrate. The non-volatile memory array 202 may be in a non-volatile solid state drive having circuitry associated with the operation of the memory cells, whether the associated circuitry is above or within the substrate. Word lines may comprise sections of the layers containing memory cells, disposed in layers above the substrate. Multiple word lines may be formed on single layer by means of trenches or other non-conductive isolating features.

The die controller 204 (also referred to as a die control circuitry) cooperates with the read/write circuits 208 to perform memory operations on memory cells of the non-volatile memory array 202 and includes a control circuit 214 (also referred to as a state machine), a decoder circuit 216 that may incorporate an address decoder 218, and a power control circuit 215. The control circuit 214 provides chip-level control of memory operations on the memory die 104a. The die controller 204 may also include power control circuit 215 that controls the power and voltages supplied to the wordlines, bitlines, and select lines during memory operations. The power control circuit 215 may include voltage circuitry, in one embodiment. Power control circuit 215 may include charge pumps for creating voltages. The sense blocks 232 include bitline drivers. The power control circuit 215 executes under control of the control circuit 214, in various embodiments.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components. In one example, the die controller may include buffers such as registers, read-only memory (ROM) fuses and other storage devices for storing default values such as base voltages and other parameters.

"Control circuit" refers to a device, component, element, module, system, sub-system, circuitry, logic, hardware, or circuit configured and/or operational to manage one or more other circuits. For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally. In certain embodiments, a control circuit is responsible to ensure that primary features and functionality of a larger circuit, die, or chip, that includes the control circuit, perform properly. The address decoder 218 provides an address interface between that used by the host or a storage controller 102 to the hardware address used by the row decoder 210 and column decoder 212. Power control circuit 215 controls the power and voltages supplied to the wordlines, bitlines, and select lines during memory operations. The power control circuit 215 includes voltage circuitry, in one embodiment. The power control circuit 215 executes under control of the control circuit 214, in one embodiment.

Commands and data are transferred between the host device and storage controller 102 via a data bus 220, and between the storage controller 102 and an input/output (IO) circuit 222 on each of the memory dies 104a-n via a memory interface 224. The memory interface 224 may be a type of communication bus, comprising a control bus 226 and a data bus 228 (also referred to herein as I/O data bus), over which fixed length command sequences 230 may be transmitted. The command bus may comprise, for example but not limited to, a command bus over which commands are transmitted to the memory die 104a and an address bus over which addresses are transmitted to the memory die 104a. "Memory interface" refers to an interface between a memory die and a storage controller. Examples of memory interface that may be used in connection with the disclosed solution include Toggle Mode ("TM"), Toggle NAND 2.0, Open NAND Flash Interface (ONFI) NAND, a vendor specific interface, a proprietary interface, and the like. In the depicted embodiment, the memory interface 224 is a proprietary interface configured to transfer fixed length command sequences 230.

"Communication bus" refers to hardware, software, firmware, logic, control line(s), and one or more associated communication protocols, that are configured to enable a sender to send data to a receiver. A communication bus may include a data bus and/or a control bus.

"Firmware" refers to logic embodied as processor-executable instructions stored on volatile memory media and/or non-volatile memory media.

"Data bus" refers to a communication bus used to exchange one or more of data bits between two electronic circuits, components, chips, die, and/or systems. A data bus may include one or more signal/control lines. A sender, such as a controller, may send data signals over one or more control lines of the data bus in parallel (operating as a parallel bus) or in series (operating as a serial bus). A data bus may include the hardware, control line(s), software, firmware, logic, and/or the communication protocol used to operate the data bus.

Examples data buses may include 8-bit buses having 8 control lines, 16-bit buses having 16 control lines, 32-bit buses having 32 control lines, 64-bit buses having 64 control lines, and the like. Control lines may carry exclusively communication data, exclusively address data, exclusively control data, or any combination of these types of data.

In various embodiments, a single data bus may be shared by a plurality of components, such as memory die. When multiple chips or memory dies share a data bus, that data may be accessed or transferred by a single memory die or by all the memory dies in parallel based on signals on a chip enable control line.

A data bus may operate, and be configured, according to an industry standard or based on a proprietary protocol and design. Multiple control line of a data bus may be used in parallel and may latch data into latches of a destination component according to a clocking signal, data strobe signal ("DQS"), or clock, such as strobe signal. In certain embodiments, a control bus and a data bus together may form a communication bus between a sender and a receiver.

"Control bus" refers to a communication bus used to exchange one or more of data, address information, control signals, clock signals, and the like, between two electronic circuits, components, chips, die, and/or systems. A control bus may comprise 1 or more control lines, be configured to operate as a parallel bus or a serial bus, and may include the hardware, control line(s), software, firmware, logic, and/or the communication protocol used to operate the control bus. Typically, a control bus sends control signals to one or more memory die to manage operations on the memory die.

In certain embodiments, the control bus sends control signals such as, for example, one or more of, a write enable ("WEn"), chip enable ("CEn"), read enable ("REn"), a clock signal, strobe signal ("DQS"), command latch enable ("CLE"), address latch enable ("ALE"), and the like.

In certain embodiments, the control bus may not transfer data relating to a storage operation, such as write data or read data. Instead, write data and read data may be transferred over a data bus. In certain embodiments, a control bus and a data bus together may form a communication bus between a sender and a receiver.

The address decoder 218 of the die controller 204 may be coupled to the memory structure 206 in order to identify a location within the memory structure 206 for a storage command. In particular, the address decoder 218 determines a row identifier and a column identifier which together identifies the location within the memory structure 206 that applies to a storage command associated with a command address. The storage command and command address are received in a fixed length command sequence.

The input/output (IO) circuit 222 may be coupled, through the memory interface 224 and to the memory interface circuit 234 of the storage controller 102, to a data bus 220 in order to receive a fixed length command sequence 230 in order to receive a fixed length command sequence 230. The decoder circuit 216 of the die controller 204 may be coupled through the input/output (IO) circuit 222 to a control bus 226 to receive fixed length command sequences 230 over the data bus 220 via memory interface circuit 234. In one embodiment, the data bus 220 may comprise eight control lines, each configured to transfer one bit in parallel across the data bus 220.

The decoder circuit 216 may decode a command address and a storage command from a fixed length command sequence. The control circuit 214 of the die controller 204 may be coupled to the input/output (IO) circuit 222 and decoder circuit 216 and may generate control signals 231 to execute storage commands decoded by the decoder circuit 216. "Control signal" refers to an electrical signal (wired or wireless) sent from one device, component, manager, or controller to another device, component, manager, or controller configured to act in response to the control signal.

The read/write circuits 208 may be coupled to the non-volatile memory array 202 and the control circuit 214 in order to transfer data between the non-volatile memory array 202 and the input/output (IO) circuit 222 in response to the storage commands.

In some implementations, some of the components can be combined. In various designs, one or more of the components (alone or in combination), other than memory structure 206, can be thought of as at least one control circuit or storage controller which is configured to perform the techniques described herein. For example, a control circuit may include any one of, or a combination of, storage controller 102, die controller 204, read/write circuits 208, column decoder 212, control circuit 214, decoder circuit 216, address decoder 218, sense blocks SB1, SB2, . . . , SBp, and so forth.

Associated circuitry may be required for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

In various embodiments, memory structure 206 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 206 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 206 is not limited to the examples above. Many different types of memory array architectures or memory technologies can be used to form memory structure 206. No particular non-volatile memory technology is required for purposes of the new claimed embodiments proposed herein. Other examples of suitable technologies for memory cells of the memory structure 206 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like.

Examples of suitable technologies for memory cell architectures of the memory structure 206 include 2D arrays, 3D arrays, cross-point arrays, stacked 2D arrays, vertical bitline arrays, and the like.

Cross point memory-one example of a ReRAM or PCM RAM-includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
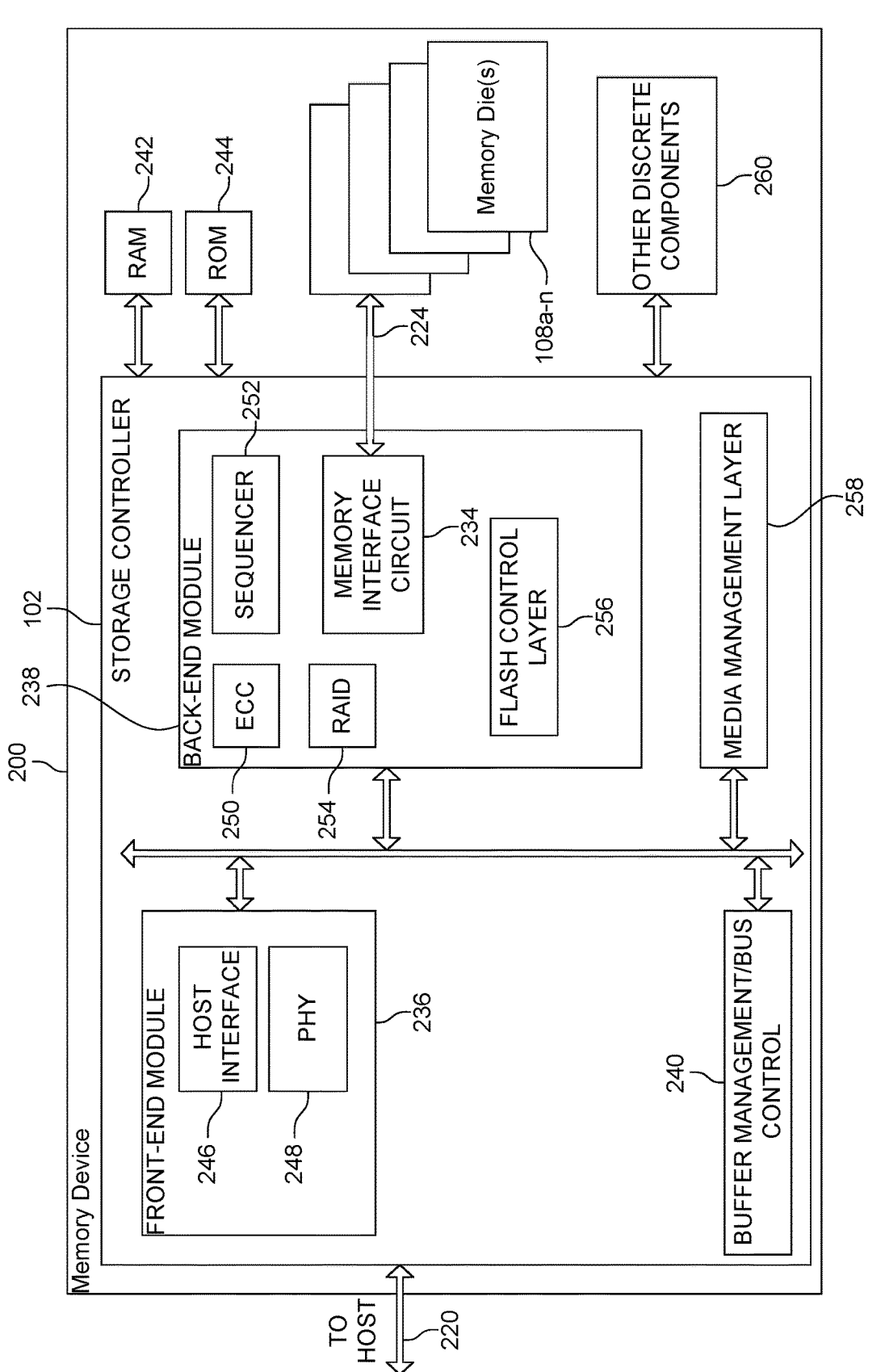
FIG. 2B is a block diagram of an example memory device that depicts more details of an example controller, in connection with which, example embodiments of the disclosed technology can be implemented.

FIG. 2B is a block diagram of example memory device 200 that depicts more details of one embodiment of controller 102. While the storage controller 102 in the embodiment of FIG. 2B is a flash memory controller, it should be appreciated that memory device 200 is not limited to flash memory. Thus, the storage controller 102 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between storage controller 102 and memory dies 104 may be any suitable flash interface, such as Toggle Mode 200, 400, or 800. In one embodiment, memory device 200 may be a card-based system, such as a secure digital (SD) or a micro secure digital (micro-SD) card. In an alternate embodiment, memory system 100 may be part of an embedded memory system. For example, the flash memory may be embedded within the host. In other examples, memory device 200 can be a solid state drive (SSD).

In some embodiments, memory device 200 includes a single channel between storage controller 102 and memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2B, storage controller 102 includes a front-end module 236 that interfaces with a host, a back-end module 238 that interfaces with the memory die 108, and various other modules that perform functions which will now be described in detail. The components of storage controller 102 depicted in FIG. 2B may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable storage controller 102 to perform the functions described herein.

Referring again to modules of the storage controller 102, a buffer manager/bus control 240 manages buffers in RAM 242 and controls the internal bus arbitration of storage controller 102. ROM 244 stores system boot code. Although illustrated in FIG. 2B as located separately from the storage controller 102, in other embodiments, one or both of RAM 242 and ROM 244 may be located within the storage controller 102. In yet other embodiments, portions of RAM 242 and ROM 244 may be located within the storage controller 102, while other portions may be located outside the controller. Further, in some implementations, the storage controller 102, RAM 242, and ROM 244 may be located on separate semiconductor dies.

Front-end module 236 includes a host interface 246 and a physical layer interface (PHY) 248 that provide the electrical host interface via bus 220 with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 238 includes an error correction code (ECC) engine 250 that encodes the data bytes received from the host, and decodes and error corrects the data bytes read from the memory dies 104. A command sequencer 252 generates command sequences, such as program and erase command sequences, to be transmitted to memory dies 104. A RAID (Redundant Array of Independent Dies) module 254 manages generation of RAID parity and recovery of failed data. The RAID parity may be used as an additional level of integrity protection for the data being written to the memory device 200. In some cases, the RAID module 254 may be a part of the ECC engine 250. Note that the RAID parity may be added as one or more extra dies, or may be added within the existing die, e.g., as an extra plane, an extra block, or extra WLs within a block. As described above in connection with FIG. 2A, the memory interface circuit 234 provides command sequences 230 to memory die 104 and receives status information from memory die 104, via memory interface 224. A flash control layer 256 controls the overall operation of back-end module 238.

Additional components of memory device 200 illustrated in FIG. 2B include media management layer (MML) 258, which performs wear leveling of memory cells of memory dies 104, as well as, other discrete components 260, such as external electrical interfaces, external RAM, resistors, capacitors, or other components that may interface with storage controller 102. In alternative embodiments, one or more of the physical layer interface 248, RAID module 254, MML 258, or buffer management/bus controller 240 are optional components.

MML 258 (e.g., Flash Translation Layer (FTL)) may be integrated as part of the flash management for handling flash errors and interfacing with the host. In particular, MML 258 may be a module in flash management and may be responsible for the internals of NAND management. In particular, MML 258 may include an algorithm in the memory device firmware which translates writes from the host into writes to the memory structure 205 of each memory die 104. MML 258 may be needed because: 1) the memory structure 206 may have limited endurance; 2) the memory structure 206 may only be written in multiples of pages; and/or 3) the memory structure 206 may not be written unless it is erased as a block (or a tier within a block in some embodiments). MML 258 understands these potential limitations of the memory structure 206 which may not be visible to the host. Accordingly, MML 258 attempts to translate the writes from host into writes into the memory structure 206.

Storage controller 102 may interface with one or more memory dies 104. In one embodiment, storage controller 102 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the memory device 200 may include one memory dies 104 connected to one storage controller 102. Other embodiments may include multiple memory dies 104 in communication with one or more controllers 102. In one example, the multiple memory dies 104 can be grouped into a set of memory packages. Each memory package may include one or more memory dies 104 in communication with storage controller 102. In one embodiment, a memory package includes a printed circuit board (or similar structure) with one or more memory dies 104 mounted thereon. In some embodiments, a memory package can include molding material to encase the memory dies 104 of the memory package. In some embodiments, storage controller 102 is physically separate from any of the memory packages.

Figure 2C:
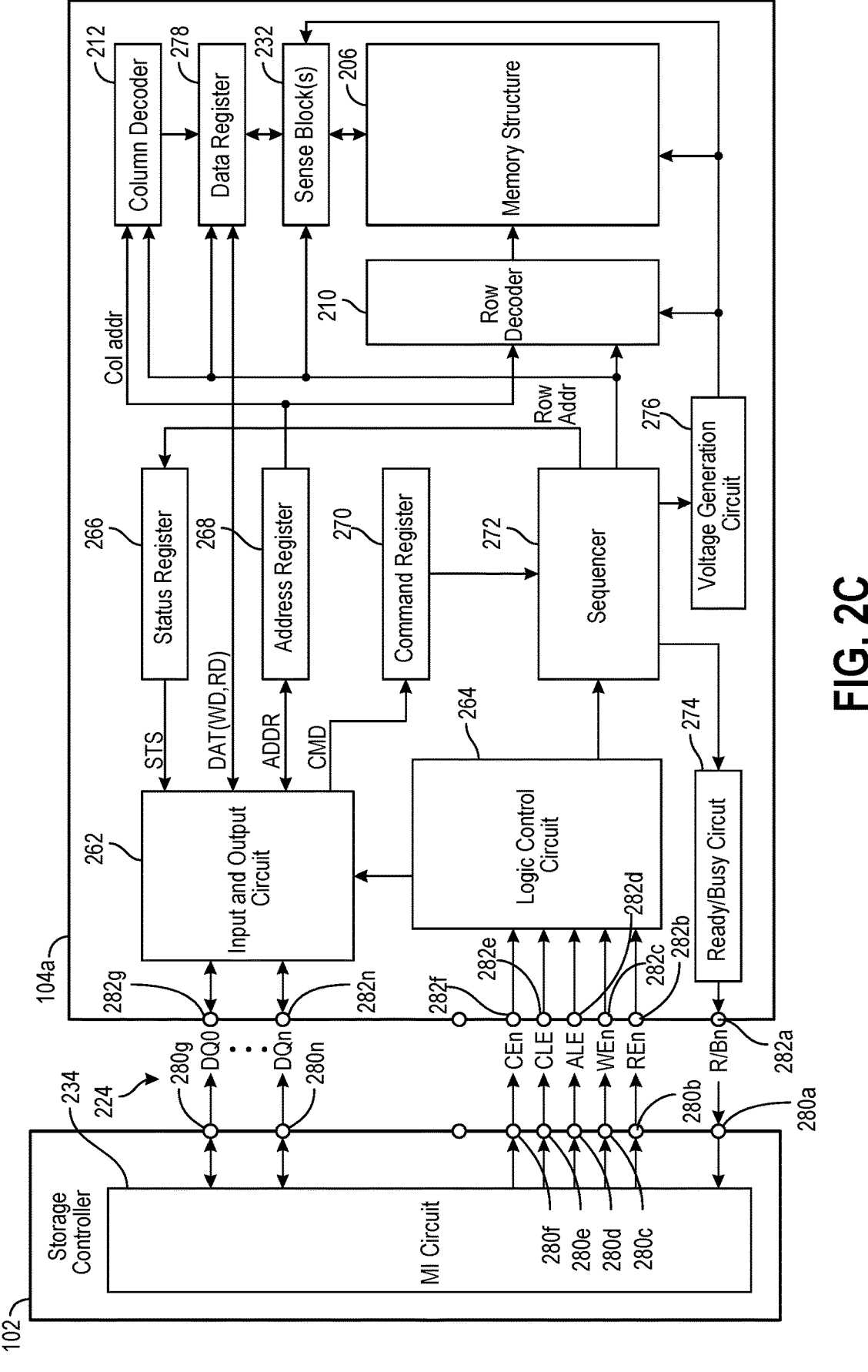
FIG. 2C is a block diagram of example memory system that depicts more details of an example embodiment of memory die, in connection with which, example embodiments of the disclosed technology can be implemented.

FIG. 2C is a block diagram of example memory system 200 that depicts more details of one embodiment of memory die 104a. With reference to FIG. 2B above, the memory die 104a is connected to the storage controller 102 via the memory interface 224 and operates based on commands from the storage controller 102.

For example, the memory die 104a transmits and receives, for example, DQ0 to DQn (hereinafter simply referred to as signals DQ or signals DQ[0:n], where n is an integer of the number of lines) to and from the storage controller 102. The DQ[0:n] signals may be an n-bit wide signa, where each DQ signal is a 1-bit wide signal. In various embodiments, n may be 7, thus DQ[7:0] signals is an 8-bit wide signal. The DQ[0:n] signals may be encoded with input/output (I/O) data, for example, data in (DIN)/data out (DOUT) for data operations (e.g., read operations, write operations, erase operations, etc.) and address data (e.g., address codes) and command data (e.g., command codes) for command/address sequencing of for the data operations. Data sent over the DQ[0:n] signals is latched with respect to a rising edge or a falling edge of a clock signal or data strobe (DQS) signal. In a single data rate ("SDR") mode, the data is latched on either the rising edge or the falling edge of the clock signal. In a double data rate ("DDR") mode (also referred to herein as toggle mode), the data is latched on both the rising and falling edges of the clock signal.

The memory die 104a also receives control signals, such as, but not limited to, CEn signal, CLE signal, ALE signal, WEn signal, REn signal, DQS signal, and the like from the storage controller 102 via the control bus 226 of the memory interface 224. Then, the memory die 104a also transmits control signals, for example but not limited to, a ready/busy signal (R/Bn) to the storage controller 102. In some embodiments, each of control signals may be a one-bit wide signal. In other embodiments, the control signals may have other bit-widths as desired.

The CEn signal is a signal for enabling the memory die 104a. In various embodiments, the CEn signal is an active-low CEn, such that the CEn is asserted at a logic LOW level (e.g., logic level 0 or low voltage (0 volt)) to enable the memory die 104a. A memory array 202 may include a plurality of memory dies 104, each of which may be substantially similar to memory die 104a and activated based on receiving the CEn signal. In some embodiments, memory dies that are not used for a specific task may remain in a standby state. In the standby state, the memory dies do not respond to control signals from the storage controller 102. After asserting the CEn signal, the activated memory die starts responding to the control signals from the storage controller 102. For example, when the storage controller 102 desires to activate memory die 104a, the storage controller 102 asserts the CEn signal at a logic LOW level.

The CLE signal is an active-high signal, according to various embodiments, for enabling command sequencing, for example, by indicating that the DQ[0:n] signal is encoded with a command code (also referred to as CMD) and is asserted, for example, at a logic HIGH level (e.g., logic level 1 or high voltage (e.g., 5 volts)), according to some embodiments. The CLE signal may be used to activate a command bus (e.g., of control bus 226) between the storage controller 102 and the memory die 104a, for example, when the CLE signal is asserted at a logic HIGH level.

The ALE signal is an active-high signal, according to various embodiments, for enabling address sequencing, for example, by indicating that the signal DQ is encoded with an address code (also referred to as ADDR) and is asserted, for example, at the logic HIGH level. The ALE signal may be used to activate an address bus (e.g., of control bus 226) between the storage controller 102 and the memory die 104a, for example, when the ALE signal is asserted at a logic HIGH level.

When the memory die 104a receives the ALE signal that is at a logic LOW level and the CLE signal that is at a logic HIGH level, the memory die 104a knows that the storage controller 102 is sending command data on the DQ[0:n] signals, which is latched into a command register 270. Similarly, when the memory die 104a receives the ALE signal at a logic HIGH level and the CLE signal at a logic LOW level, the memory die 104a knows that address data is being sent by the storage controller 102 and the address data is latched into an address register 268 of the memory die 104a.

The WEn signal is a clock signal for sampling a received signal into the memory die 104a. For example, a signal received by the memory die 104a is sampled and latched at each rising or falling edge of the WEn signal to obtain a bit pattern encoded into the received signal. Accordingly, DQ[0:n] signals are received in the memory die 104a when the WEn signal is toggled. For example, command data and/or address data sent to the memory die 104a may be latched with respect to a rising edge and/or a falling edge of the WEn signal. In various embodiments, WEn signal may be latched in SDR mode or DDR mode.

The REn signal is a signal used for the storage controller 102 to read data from the memory die 104a. For example, data is read out of the memory die 104a at each rising or falling edge of the REn signal. Accordingly, the memory die 104a outputs the DQ[0:n] signals to the storage controller 102 based on the toggled REn signal. The R/Bn signal is a signal indicating whether the memory die 104a is in a busy state or a ready state (in a state in which a command is not receivable or receivable from the storage controller 102) and is considered to be at the logic LOW level, for example, when the memory die 104a is in the busy state.

While the above example provides the CEn signal as an active-low signal and the CLE and ALE signals as active-high signals, other implementations are possible. In some embodiments, the active states may be reversed. For example, the CEn signal may be an active-high signal and the CLE and ALE signals may be active-low signals.

The storage controller 102 issues a command to perform a read operation, a command to perform a write operation, a command to perform an erase, or the like to the memory die 104a in response to a command from a host device (e.g., host device 106 and/or 112). The storage controller 102 manages the memory space of the memory die 104a. As part of the read, write, or erase operations, the memory die 104a issues various commands to perform command/address sequencing for a respective operation and the memory die 104a and/or storage controller 102 transmit DIN/DOUT to complete the respective operation.

As described above, the memory interface circuit 234 of the storage controller 102 connects to the input/output circuit 222 of the memory die 104a via a plurality of electrical contacts. As used herein, electrical contacts may be referred to as pins or pins of a chip for electrically connecting the memory die 104a to the storage controller 102. For example, the storage controller 102 includes a plurality of pins 280a-n electrically connected to a plurality of pins 282a-n of the memory die 104a. The memory interface circuit 234 transmits the CEn signal, CLE signal, ALE signal, and WEn signals to the memory die 104a over the control bus 226 of the memory interface 224 via respective pins and transmits DQ[0:n] signals over the data bus 228 of the memory interface 224 via respective pins. The input/output circuit 222 transmits the R/Bn signal to the storage controller 102 over the control bus 226 and the DQ[0:n] signals over the data bus 228 via respective pins. The pins may also be referred to as receivers or transmitters. For example, where a signal is transmitted from a pin on the storage controller to a pin of the memory die, the transmitting pin may be referred to as an transmitter and the receiving pin may be referred to as a receiver. Each pin may be referred to as either a receiver or output transmitted based on the scenario, for example, one pin may transmit at a first instance while the pin may also receive at a second instance.

As illustrated in FIG. 2C, the memory die 104a includes an input and output circuit 262, a logic control circuit 264, a status register 266, an address register 268, a command register 270, a sequencer 272, a ready/busy circuit 274, a voltage generation circuit 276, and a data register 278. The various components 262-278 may be included as part of the die controller 204, for example, as part of the control circuit 214 and/or decoder circuit 216. FIG. 2C also illustrates the memory structure 206, row decoder 210, a sense blocks 232, and column decoder 212, as described above in connection with FIG. 2B.

The input and output circuit 262 controls input and output of the DQ[0:n] signals to and from the storage controller 102. For example, the input and output circuit 262 transmits data received from the storage controller 102 as DIN to data register 278, transmits an address code to the address register 268, and transmits a command code to the command register 270. DIN, the command code, and the address are transmitted to the memory die 104a as DQ[0:n] signals encoded with a bit pattern for the DIN, command, or address. The input and output circuit 262 also transmits status information STS received from the status register 266, data received from the data register 278 to be transmitted to the storage controller 102 as DOUT. STS and DOUT are transmitted as DQ[0:n] signals encoded with a bit pattern for the STS or DOUT. The input and output circuit 262 and the data register 278 are connected via a data bus. For example, the data bus includes eight I/O data lines 100 to 107 corresponding to the 8-bit signals DQ0 to DQ7. The number of I/O data lines is not limited to eight, but may be set to 16, 32, or any number of data lines.

The logic control circuit 264 receives, for example, the CEn signal, the CLE signal, the ALE signal, the WEn signal, and the REn signal from the storage controller 102 via control bus 226. Then, logic control circuit 264 controls the input and output circuit 262 and the sequencer 272 in accordance with a received signal.

The status register 266 temporarily stores status information STS, for example, in a write operation, a read operation, and an erasing operation for data and notifies the storage controller 102 whether the operation normally ends.

The address register 268 temporarily stores the address code received from the storage controller 102 via the input and output circuit 262. For example, the input and output circuit 262 may detect DQ[0:n] signals and sample the DQ[0:n] signals according to the WEn signal to obtain a bit pattern encoded thereon. The input and output circuit 262 may then decode the bit pattern to obtain the data, which in this case may be an address code. The address code is then temporarily stored in the address register 268. Then, the address register 268 transmits a row address (row addr) to the row decoder 210 and transmits a column address (col addr) to the column decoder 212.

The command register 270 temporarily stores the command code received from the storage controller 102 via the input and output circuit 262 and transmits the command code to the sequencer 272. For example, the input and output circuit 262 may detect DQ[0:n] signals and sample the DQ[0:n] signals according to the WEn signal to obtain a bit pattern encoded thereon. The input and output circuit 262 may then decode the bit pattern to obtain the data, which in this case may be a command code. The command code is then temporarily stored in the command register 270.

The sequencer 272 controls operation of the memory die 104*a*. For example, the sequencer 272 controls the status register 266, the ready/busy circuit 274, the voltage generation circuit 276, the row decoder 210, the sense blocks 232, the data register 278, the column decoder 212, and the like according to a command code stored in the command register 270 to execute the write operation, the read operation, and the erasing operation according to the code.

The ready/busy circuit 274 transmits the R/Bn signal to the storage controller 102 according to an operation state of the sequencer 272. For example, the R/Bn signal is transmitted to the storage controller 102 via the control bus 226 of the memory interface 224.

The voltage generation circuit 276 generates a voltage necessary for an operation (e.g., a write operation, a read operation, or an erasing operation) according to control of the sequencer 272. The voltage generation circuit 276 may be an example of the power control circuit 215 of FIG. 2A. The voltage generation circuit 276 supplies the generated voltage, for example, to the memory structure 206, the row decoder 210, and the sense blocks 232. The row decoder 210 and the sense blocks 232 apply a voltage supplied from the voltage generation circuit 276 to memory cells in the memory structure 206. Details of the memory structure 206 are provided in connection with FIGS. 3-4G below.

The data register 278 includes a plurality of latch circuits. The latch circuit stores the write data WD and the read data RD. For example, in a write operation, the data register 278 temporarily stores the write data WD received from the input and output circuit 262 and transmits the write data WD to the sense blocks 232. For example, in a read operation, the data register 278 temporarily stores the read data RD received from the sense blocks 232 and transmits the read data RD to the input and output circuit 262.

Figure 3:
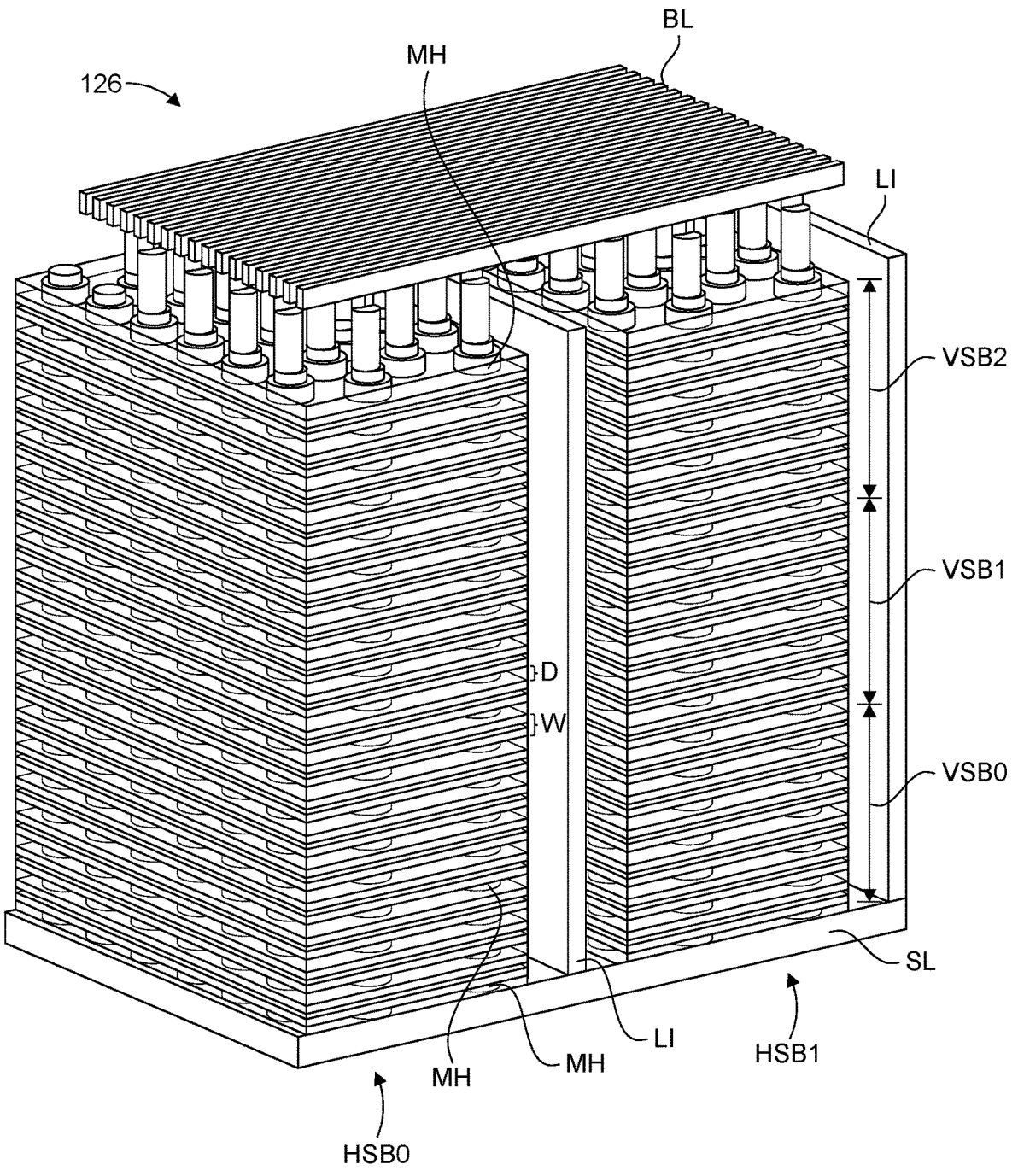
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 206 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 206 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
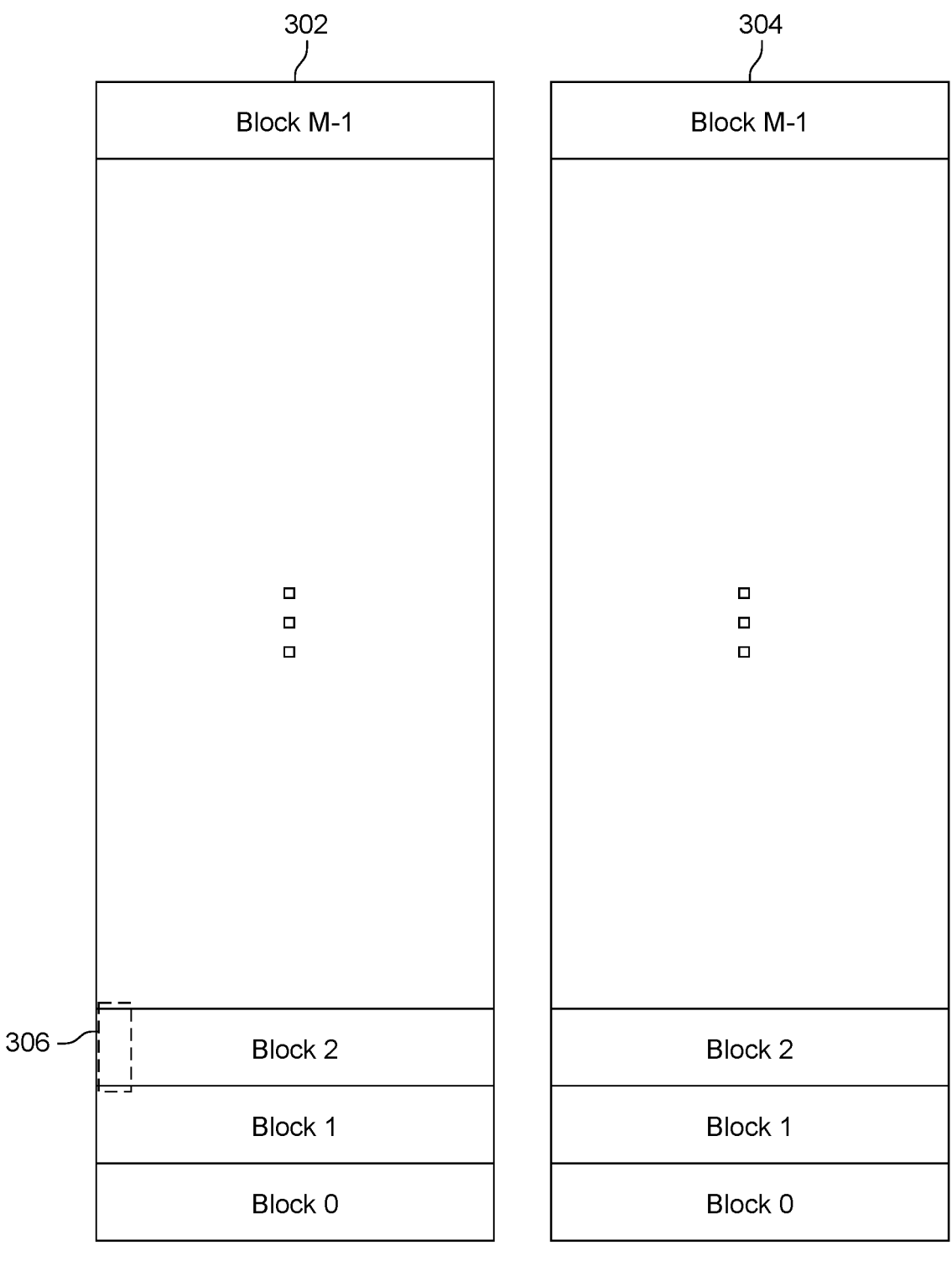
FIG. 4A is a block diagram of an example memory structure having two planes, in connection with which, example embodiments of the disclosed technology can be implemented.

FIG. 4A is a block diagram depicting one example organization of memory structure 206, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 206 to enable the signaling and selection circuits. In some embodiments, a block represents a groups of connected memory cells that share a common set of wordlines.

Figure 4B:
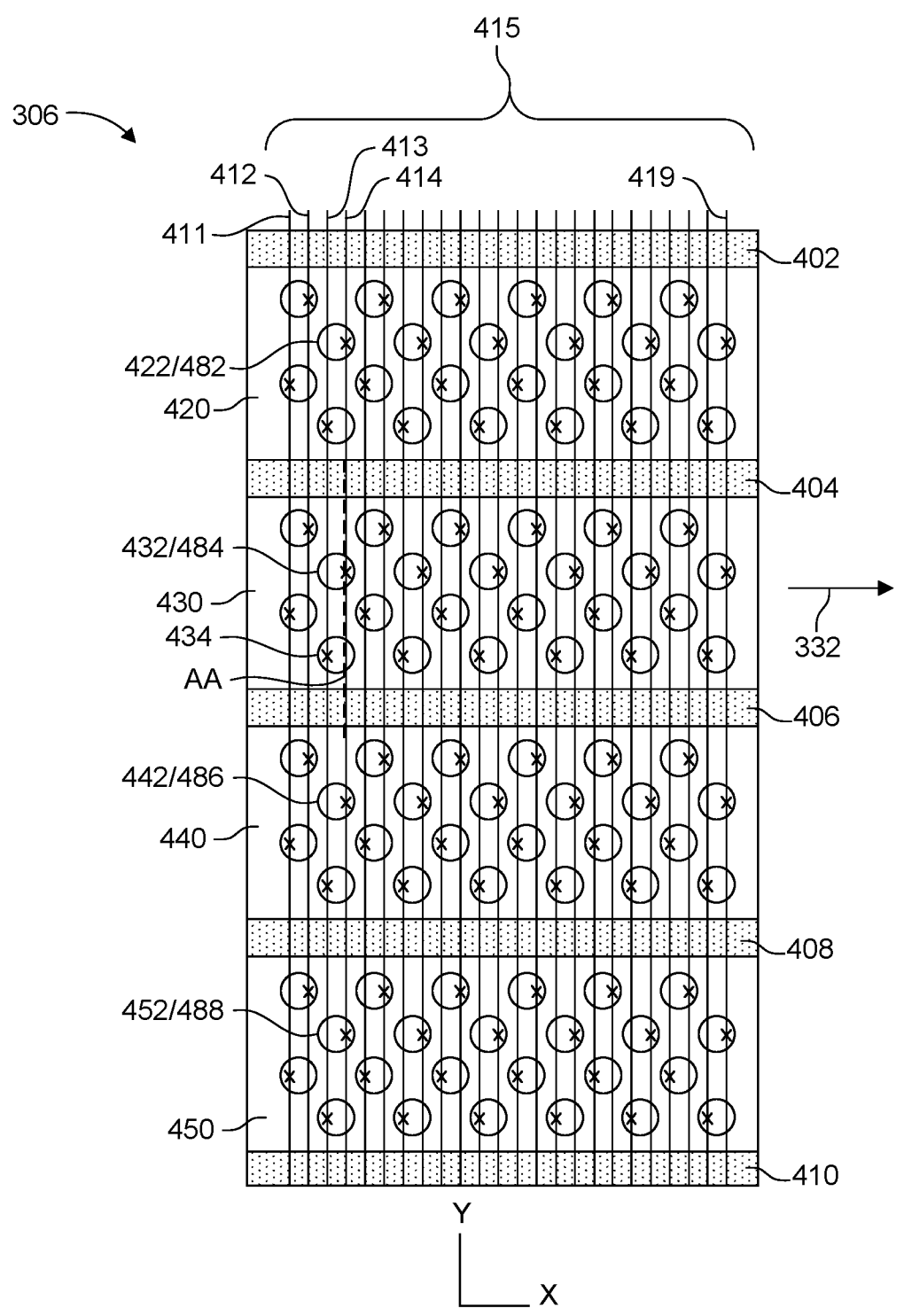
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 206 of FIGS. 2A and 2B. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 206. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
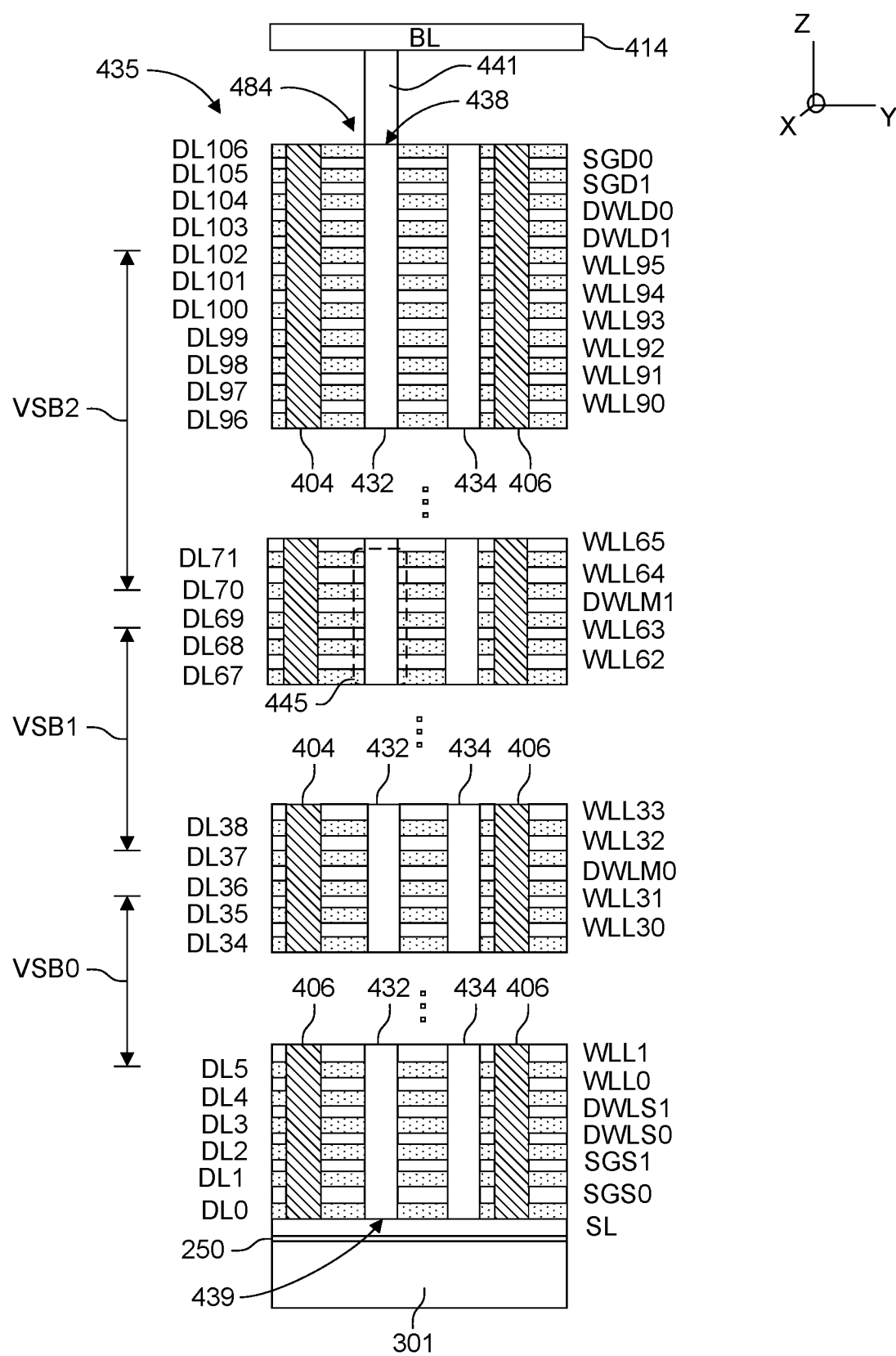
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
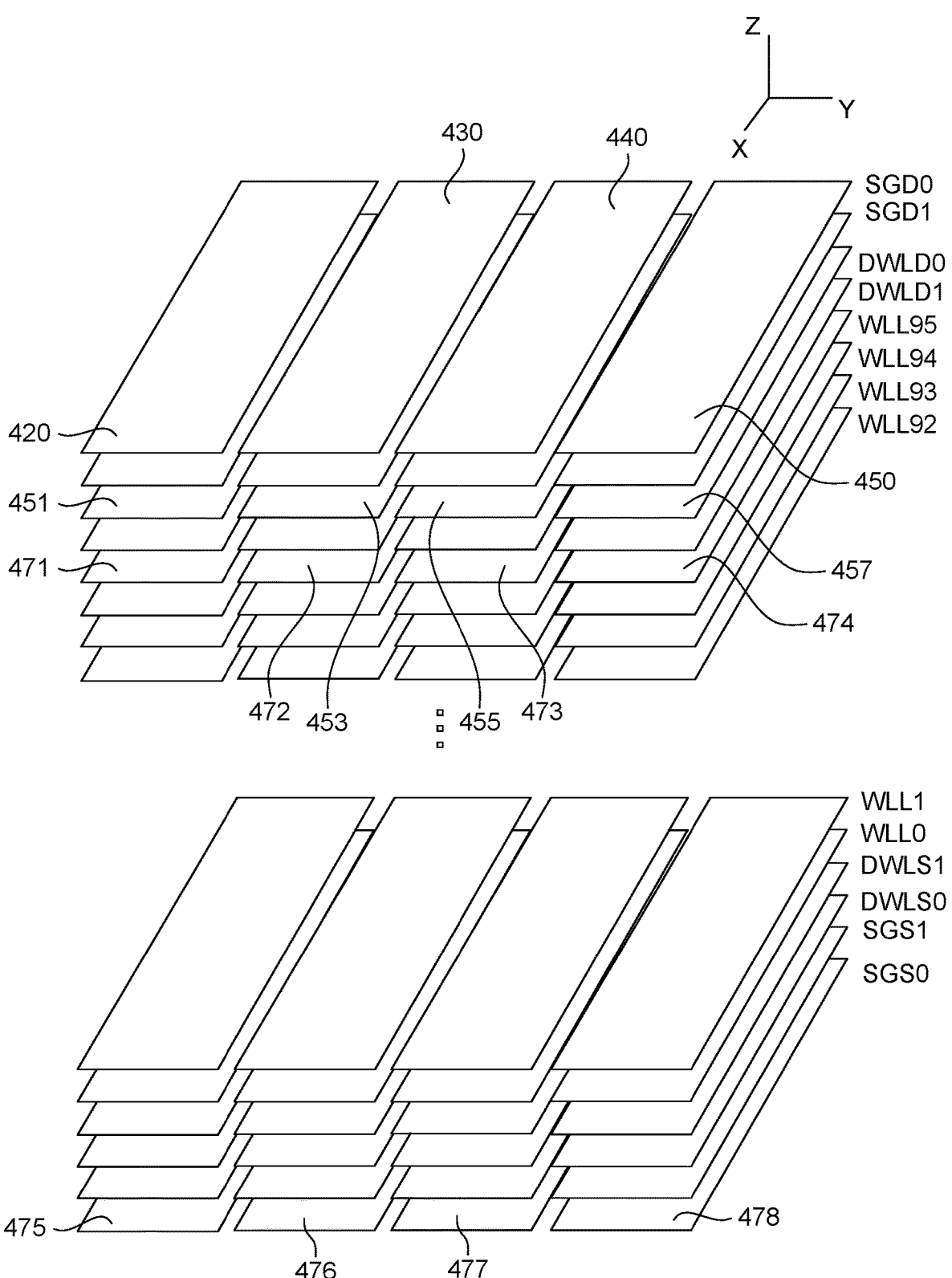
FIG. 4D depicts an alternative view of the select gate layers and wordline layers of the stack of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy word-line layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently con-trolled, while in other embodiments, the SG lines are con-nected and commonly controlled.

Figure 4E:
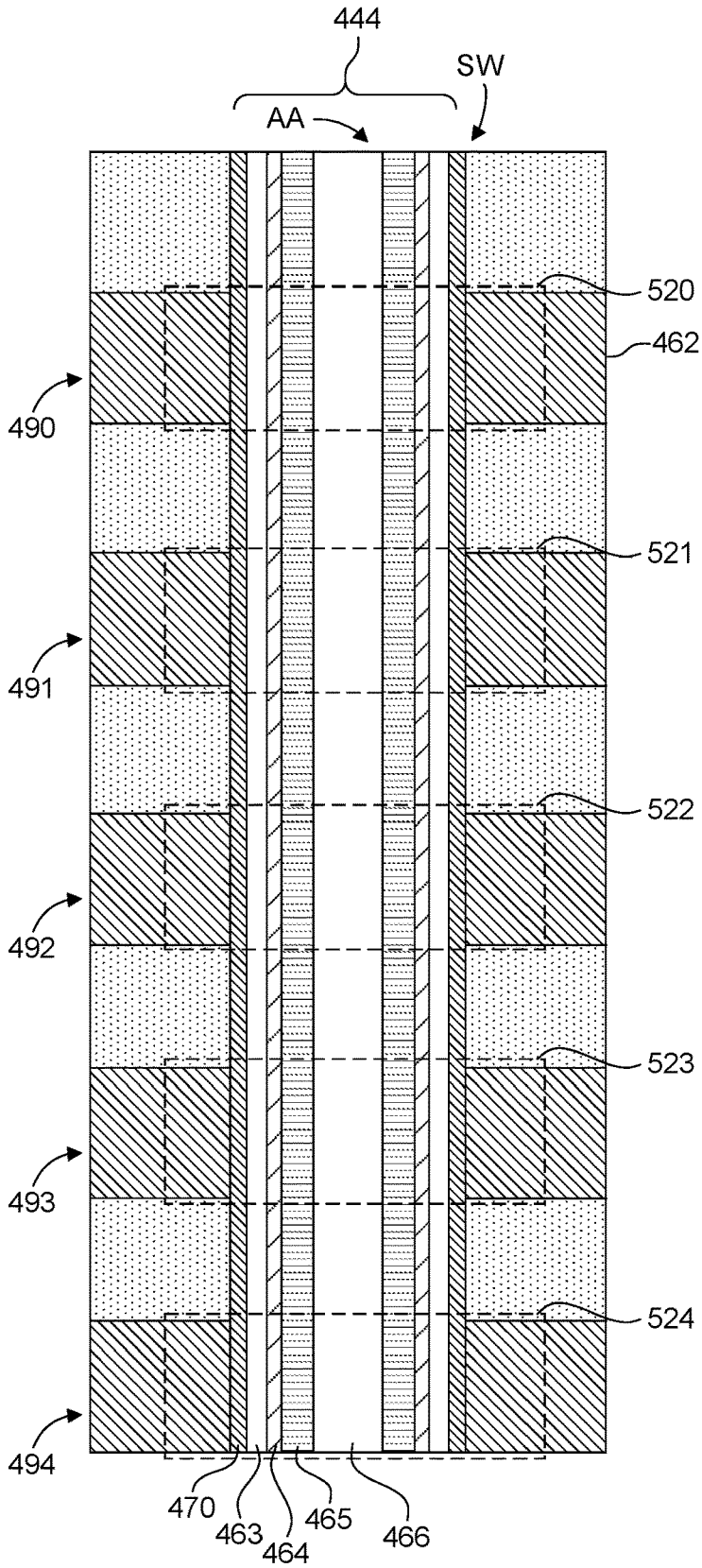
FIG. 4E depicts a view of a region of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trap-ping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
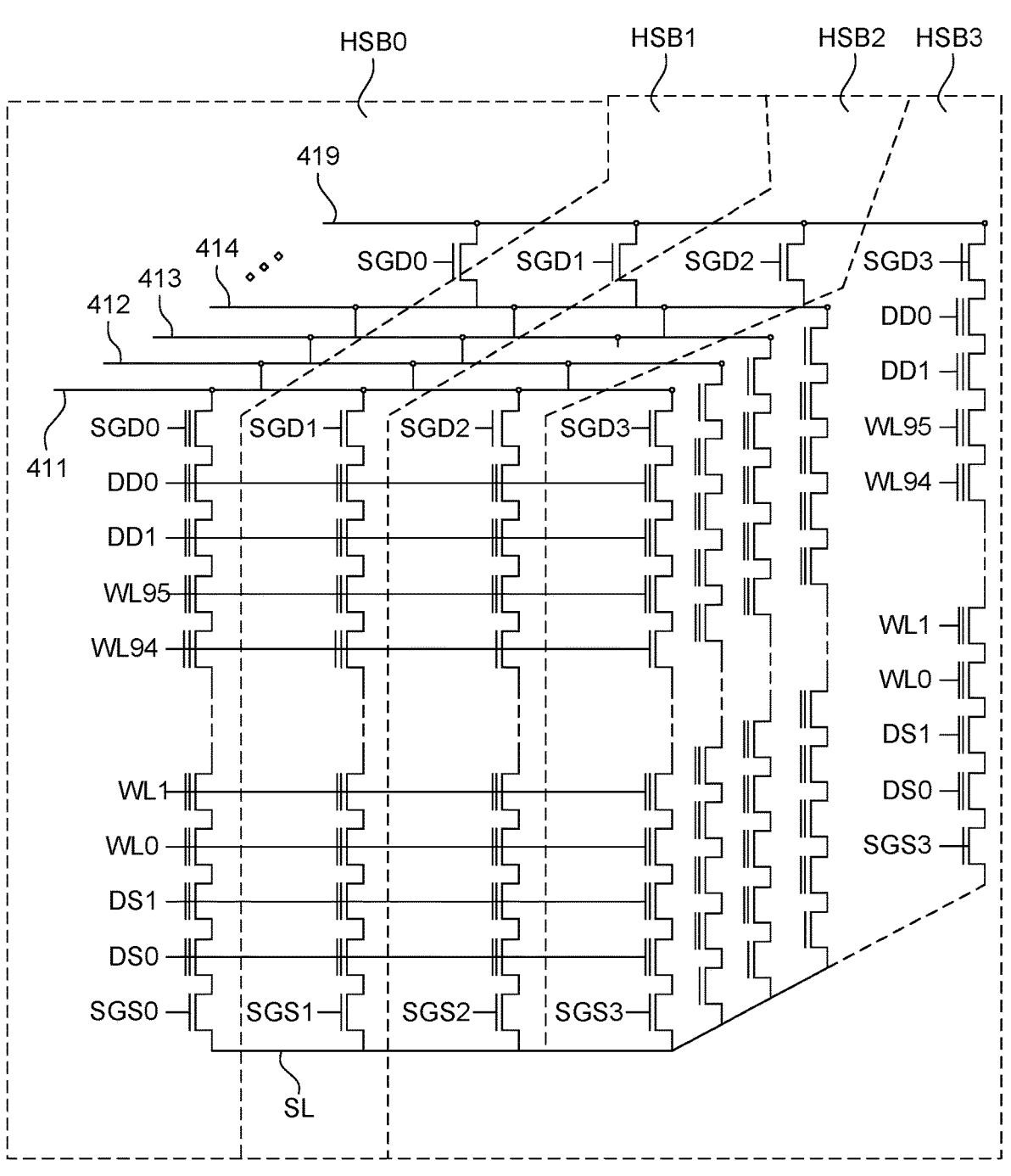
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
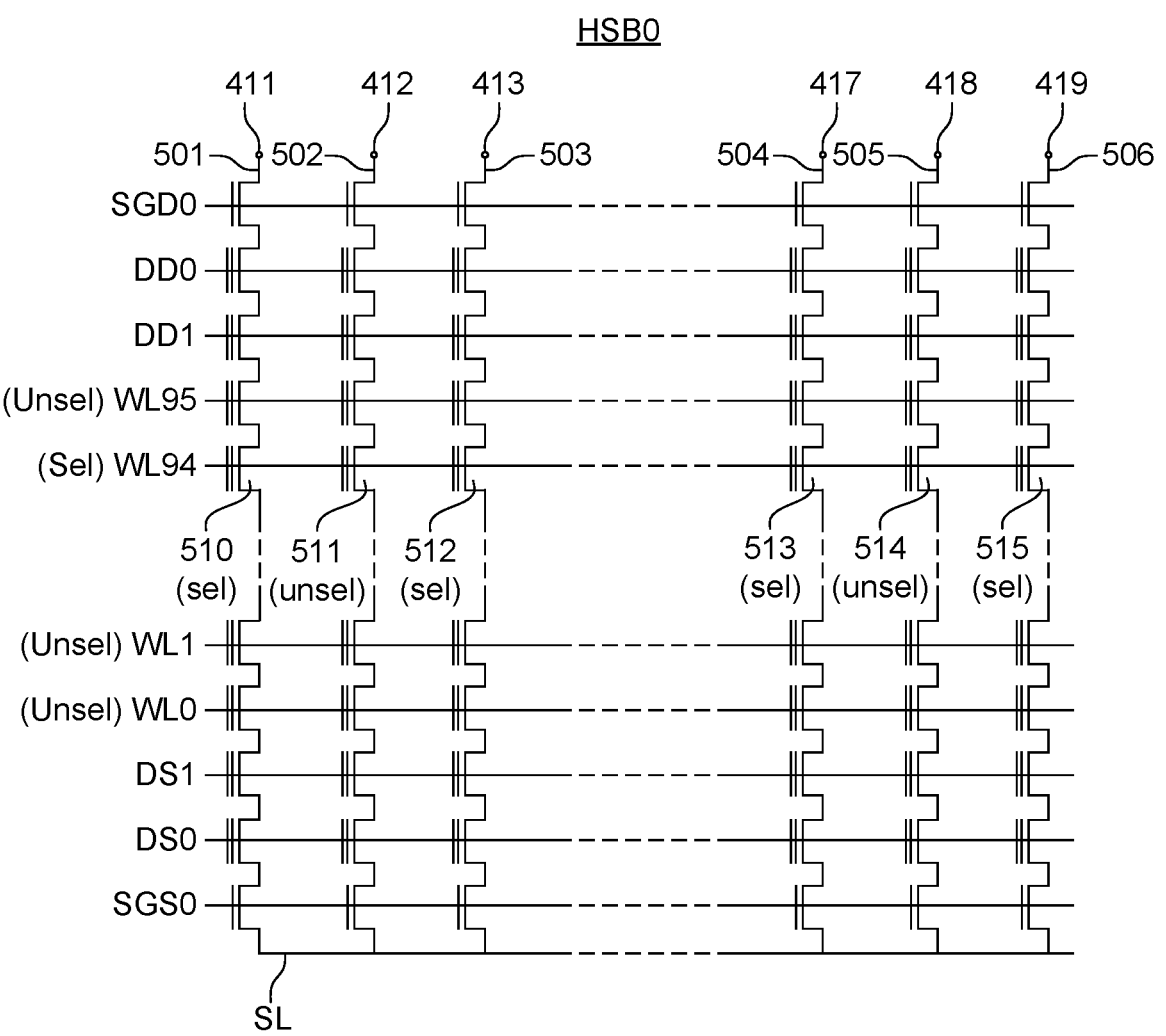
FIG. 4G is a schematic of a plurality of NAND strings showing one example horizontal sub-block, in connection with which, example embodiments of the disclosed technology can be implemented.
Figure 4H:
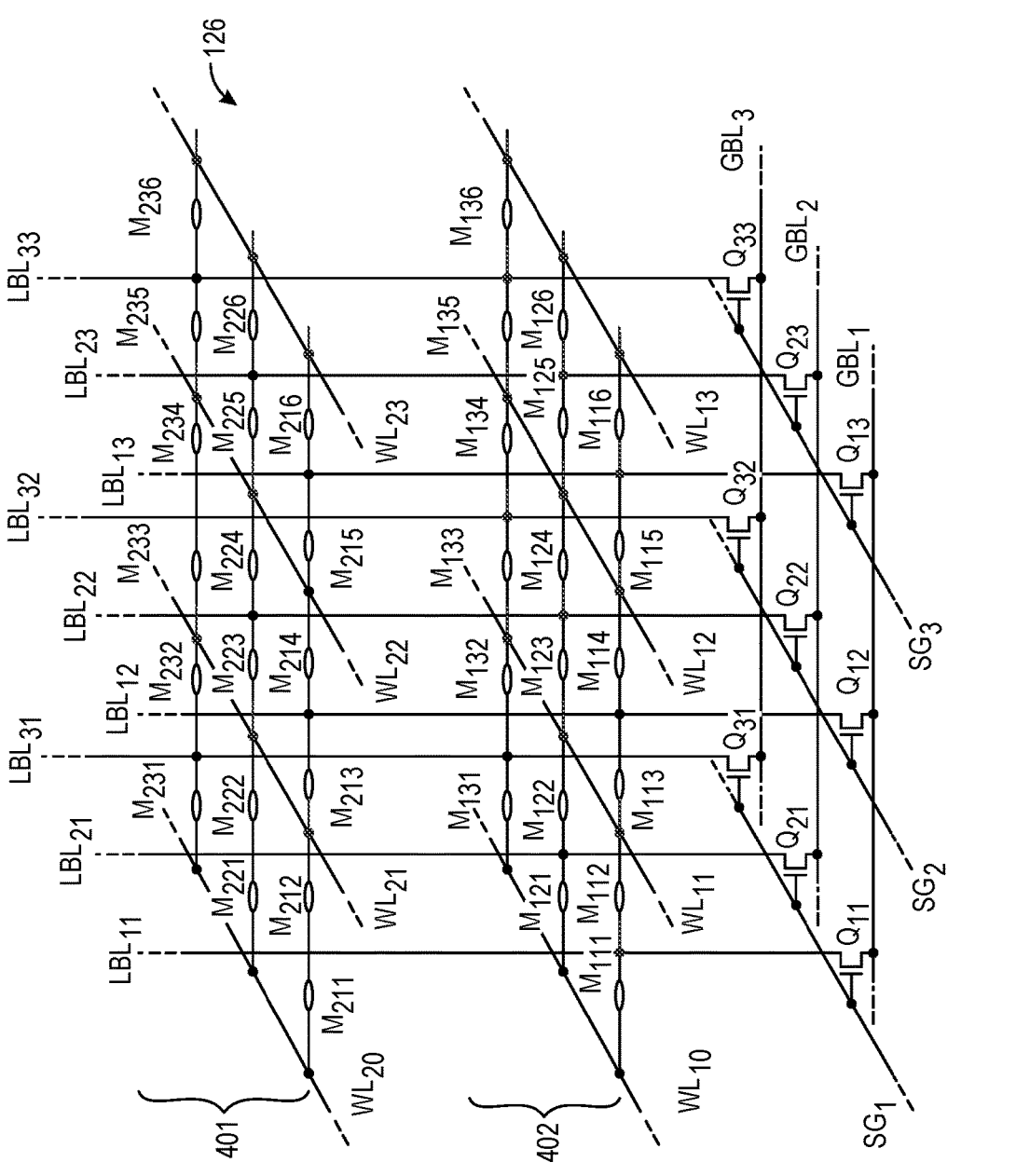
FIG. 4H depicts various embodiments of a portion of a three-dimensional memory array with a vertical cross-point structure, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory archi- tecture, the memory type, and the memory operation, unse- lected memory cells may be actively or passively excluded from being subjected to the memory operation.

As an example of selected memory cells and unselected memory cells, during a programming process, the set of memory cells intended to take on a new electrical charac- teristic (or other characteristic) to reflect a changed pro- gramming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming opera- tion is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the program- ming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unsel in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

FIG. 4H illustrates another memory structure that can be used for the structure 126 of FIG. 1A. FIG. 4H illustrates a three-dimensional vertical cross-point structure, the word- lines still run horizontally, with the bitlines oriented to run in a vertical direction.

FIG. 4H depicts one embodiment of a portion of a monolithic three-dimensional memory array structure 126 that includes a first memory level 402 positioned below a second memory level 401. As depicted, the local bitlines LBL11-LBL33 are arranged in a first direction (e.g., a vertical direction) and the wordlines WL10-WL23 are arranged in a second direction perpendicular to the first direction. This arrangement of vertical bitlines in a mono- lithic three-dimensional memory array is one embodiment of a vertical bitline memory array. As depicted, disposed between the intersection of each local bitline and each wordline is a particular memory cell (e.g., memory cell M111 is disposed between local bitline LBL11 and wordline WL10). This structure can be used with a number of different memory cell structures. In one example, the par- ticular memory cell may include a floating gate device or a charge trap device (e.g., using a silicon nitride material). In another example, the particular memory cell may include a reversible resistance-switching material, a metal oxide, a phase change memory (PCM) material, or a ReRAM mate- rial. The global bitlines GBL1-GBL3 are arranged in a third direction that is perpendicular to both the first direction and the second direction. A set of bitline select devices (e.g., Q11-Q31), such as a vertical thin film transistor (VTFT), may be used to select a set of local bitlines (e.g., LBL11- LBL31). As depicted, bitline select devices Q11-Q31 are used to select the local bitlines LBL11-LBL31 and to connect the local bitlines LBL11-LBL31 to the global bit- lines GBL1-GBL3 using row select line SG1. Similarly, bitline select devices Q12-Q32 are used to selectively con- nect the local bitlines LBL12-LBL32 to the global bitlines GBL1-GBL3 using row select line SG2 and bitline select devices Q13-Q33 are used to selectively connect the local bitlines LBL13-LBL33 to the global bitlines GBL1-GBL3 using row select line SG3.

Referring to FIG. 4H, as only a single bitline select device is used per local bitline, only the voltage of a particular global bitline may be applied to a corresponding local bitline. Therefore, when a first set of local bitlines (e.g., LBL11-LBL31) is biased to the global bitlines GBL1- GBL3, the other local bitlines (e.g., LBL12-LBL32 and LBL13-LBL33) must either also be driven to the same global bitlines GBL1-GBL3 or be floated. In one embodi- ment, during a memory operation, all local bitlines within the memory array are first biased to an unselected bitline voltage by connecting each of the global bitlines to one or more local bitlines. After the local bitlines are biased to the unselected bitline voltage, then only a first set of local bitlines LBL11-LBL31 are biased to one or more selected bitline voltages via the global bitlines GBL1-GBL3, while the other local bitlines (e.g., LBL12-LBL32 and LBL13- LBL33) are floated. The one or more selected bitline volt- ages may correspond with, for example, one or more read voltages during a read operation or one or more program- ming voltages during a programming operation.

Figure 5:
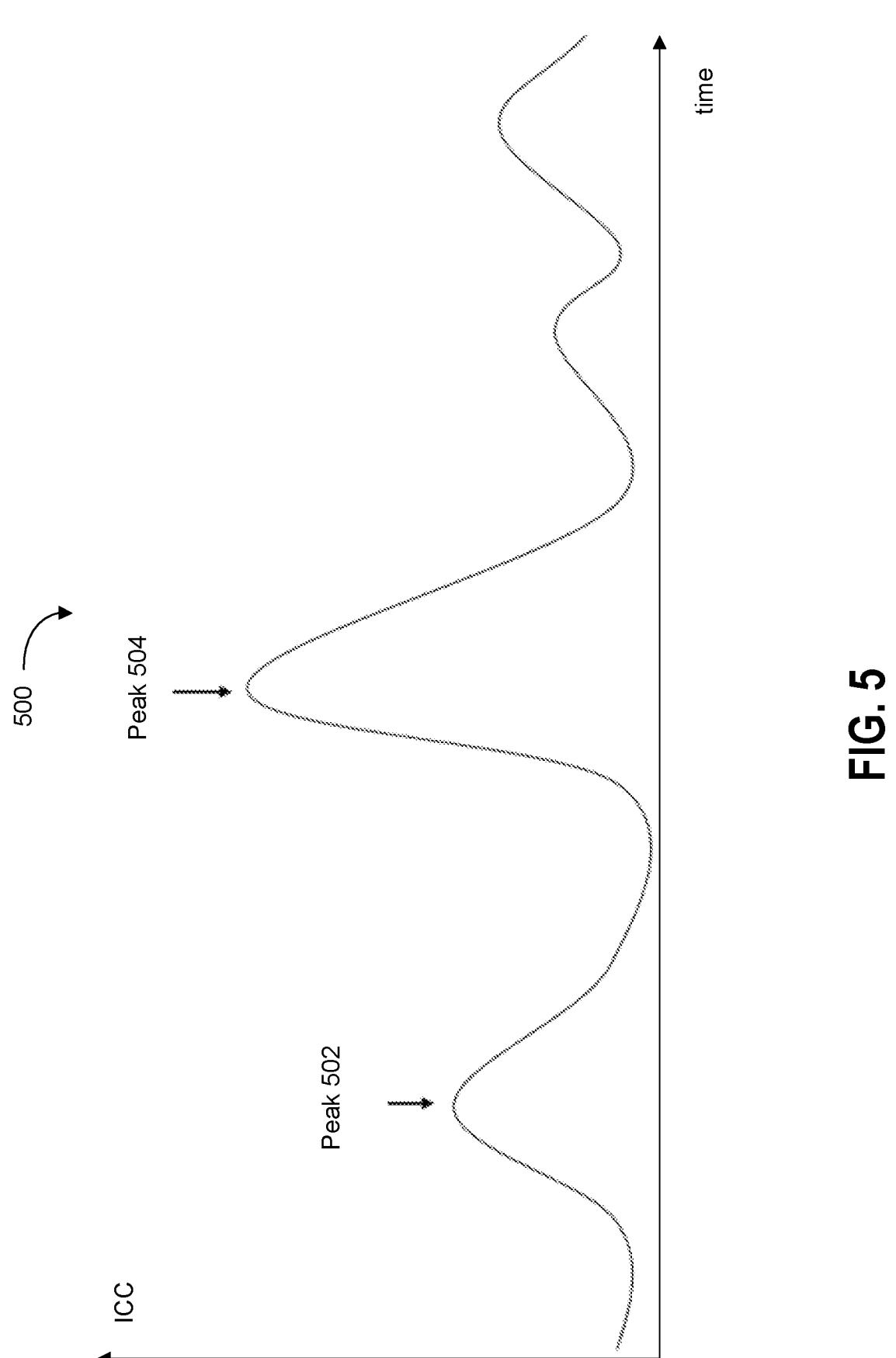
FIG. 5 depicts an example graph illustrating ICC over time for a memory die, in accordance with embodiments of the present technology.

FIG. 5 depicts an example graph 500 illustrating ICC over time for a memory die, in accordance with embodiments of the presently disclosed technology.

As alluded to above, in practicing the present methodol- ogy for determining that an ICC peak of a memory die deviates from a target ICC peak value based on an estimated temperature rise, embodiments of the present technology intelligently leverage a couple important insights. For instance, in many cases the (overall) ICC peak for a memory die will be the maximum ICC value drawn/consumed by a wordline ramp up pump during a wordline ramp up process performed before a read operation. Moreover, even when an actual ICC peak for a memory die is drawn/consumed during a read operation involving a large number of con- ducting memory cells, the maximum ICC value drawn/ consumed by a wordline ramp up pump during the wordline ramp up process will serve as a close approximation of the actual ICC peak. ICC values associated with the above-described process are depicted in graph 500-which illustrates ICC over time for an example memory die.

As depicted, graph 500 includes a local peak 502. Local peak 502 is associated with the ICC drawn/consumed by a wordline ramp up pump during a wordline ramp up process. As alluded to above, in many cases the (overall) ICC peak for a memory die will be the maximum ICC value drawn/consumed by the wordline ramp up pump during this process. In general, the ICC drawn/consumed across all wordline ramp up processes (performed before each read operation) will be the same/similar as the wordline ramp up process does not depend on the number of memory cells conducting for a given read operation.

As depicted, graph 500 also includes a local peak 504. Local peak 504 may be associated with the ICC drawn/consumed by all the conducting memory cells during a read operation. The ICC drawn/consumed during read operations can vary based on the number of conducting memory cells for the individual read operations. Accordingly, in some cases the ICC drawn/consumed by conducting memory cells during a read operation (e.g., illustrated by local peak 504) may be higher than the ICC drawn/consumed by the wordline ramp up pump during the wordline ramp up process (e.g., illustrated by local peak 502). However, as embodiments of the present technology are designed in appreciation of, in most cases the maximum ICC values associated with these processes will be similar in magnitude. Thus, even if the ICC drawn/consumed by conducting memory cells during a read operation is (marginally) higher than the ICC drawn/consumed by the wordline ramp up pump during the wordline ramp up process—the maximum ICC value associated with the wordline ramp up process will be a good estimate/approximation of (overall) ICC peak for the memory cell.

Figure 6:
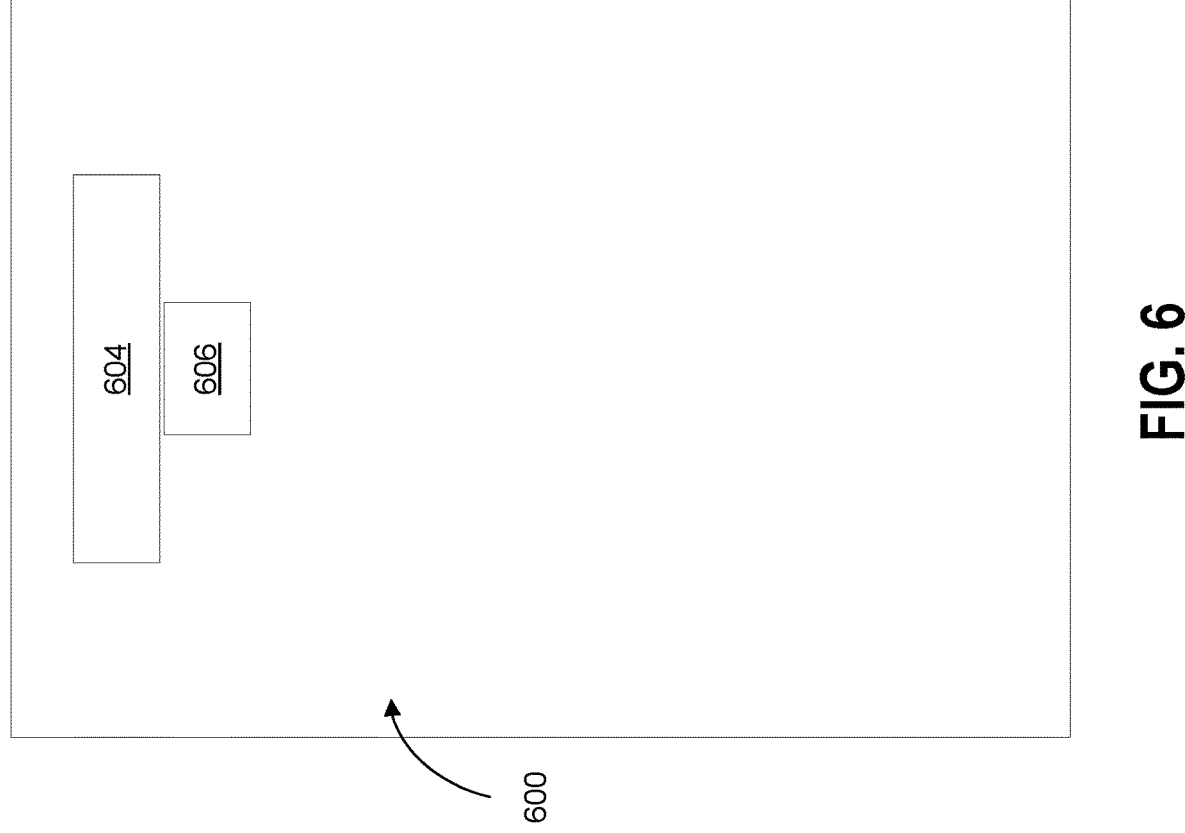
FIG. 6 depicts an example memory die, in accordance with embodiments of the present technology.

FIG. 6 depicts an example memory die 600, in accordance with embodiments of the present technology.

As depicted, memory die 600 includes a wordline ramp up pump 604, and a temperature sensor 606.

Wordline ramp up pump 604 may drive a wordline ramp up process performed before a read operation. In various examples, the wordline ramp up process energizes unselected wordlines in advance of the read operation. As alluded to above, the wordline ramp process generally draws/consumes a large ICC—and thus the maximum ICC drawn/consumed during the wordline ramp process can serve as a close approximation of (overall) ICC peak for memory die 600.

As depicted, temperature sensor 606 is implemented on a substrate region of memory die 600 located proximate to wordline ramp up pump 604. In various implementations, temperature sensor 606 may be located between 10 micrometers (μm) and 100 μm of wordline ramp up pump 604 for improved performance/reliability. An important insight that embodiments of the present technology are designed in appreciation of is that temperature rise of a substrate region located proximate to a wordline ramp up pump (e.g., the substrate region of memory die 600 onto which temperature sensor 606 is implemented) can closely correlate with a rise in the ICC drawn/consumed by the wordline ramp up pump during a wordline ramp up process. This is because a portion of the ICC drawn/consumed by the wordline ramp up process flows through the substrate region, heating the substrate region in an approximate linear relationship to the magnitude of the current flowing through the substrate region. Embodiments leverage this insight to effectively estimate ICC peak for the memory die based on the temperature rise for the substrate region during the wordline ramp up process.

It should also be understood that temperature sensors (e.g., temperature sensor 606) are generally smaller and less expensive than inductor components that measure electrical current directly. Due to large form factor and expense, implementing such inductor components onto a memory die is generally infeasible. For this reason, ICC peak for a memory die is conventionally measured using external test equipment. Such testing is generally time and resource intensive, and thus infeasible to do at large scale.

However, implementing a temperature sensor (e.g., temperature sensor 606) onto a memory die is much more feasible due to the temperature sensor's relatively smaller form factor and expense. Thus, leveraging a small/inexpensive temperature sensor and the insights described above, embodiments of the present technology enable individual memory dies to: (1) self-estimate ICC peak; and (2) self-adjust operational parameters such that they achieve target ICC peak values—thereby improving performance for the individual memory dies. Relatedly, memory die vendors can leverage embodiments to facilitate mass scale ICC peak-related data collection—making it easy for such vendors to make informed design and parameter adjustments to achieve the target ICC peak with greater consistency.

Figure 7A:
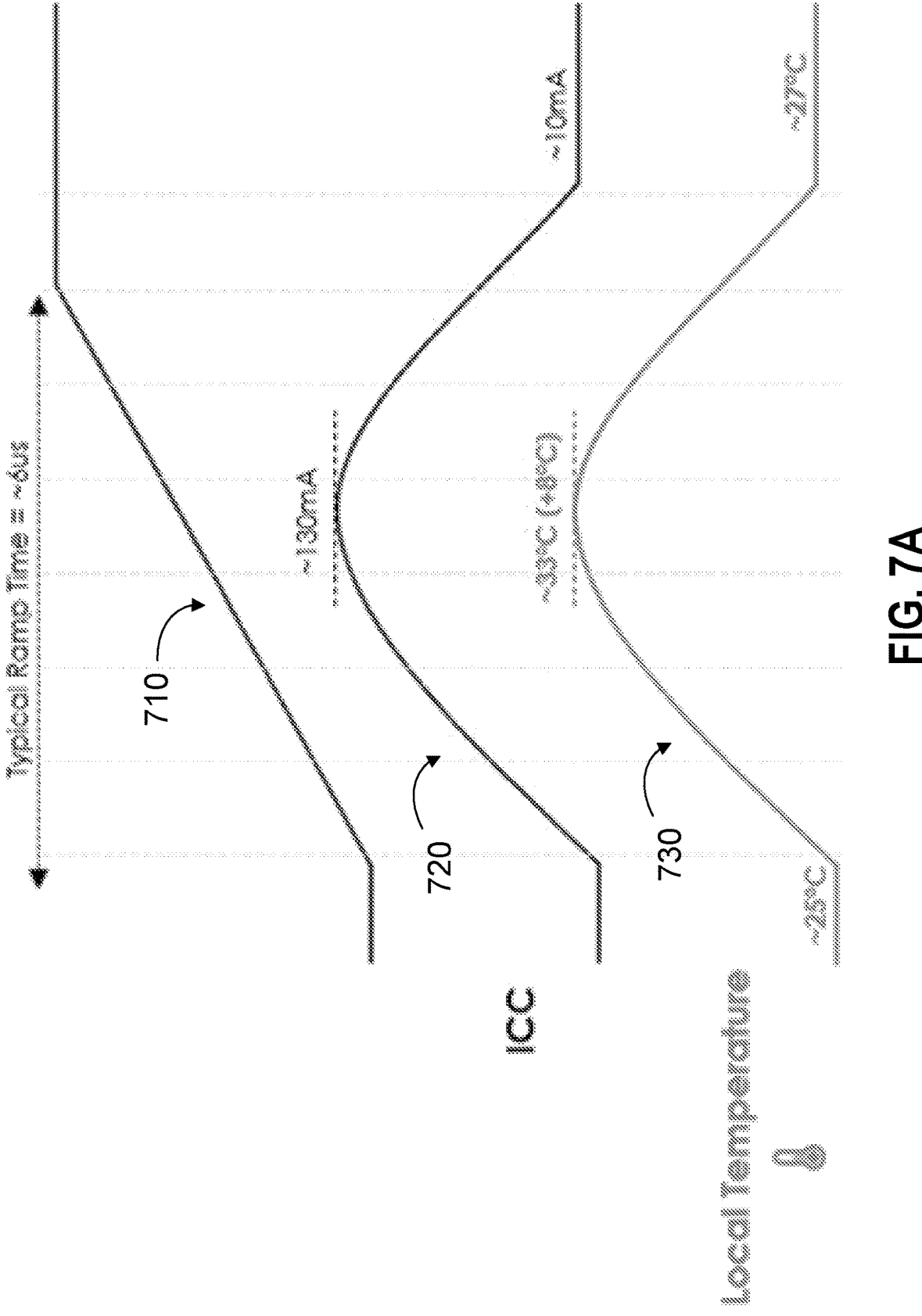
FIGS. 7A and 7B depict example graphs illustrating various parameters of a memory die during a wordline ramp up process, in accordance with embodiments of the present technology.
Figure 7B:
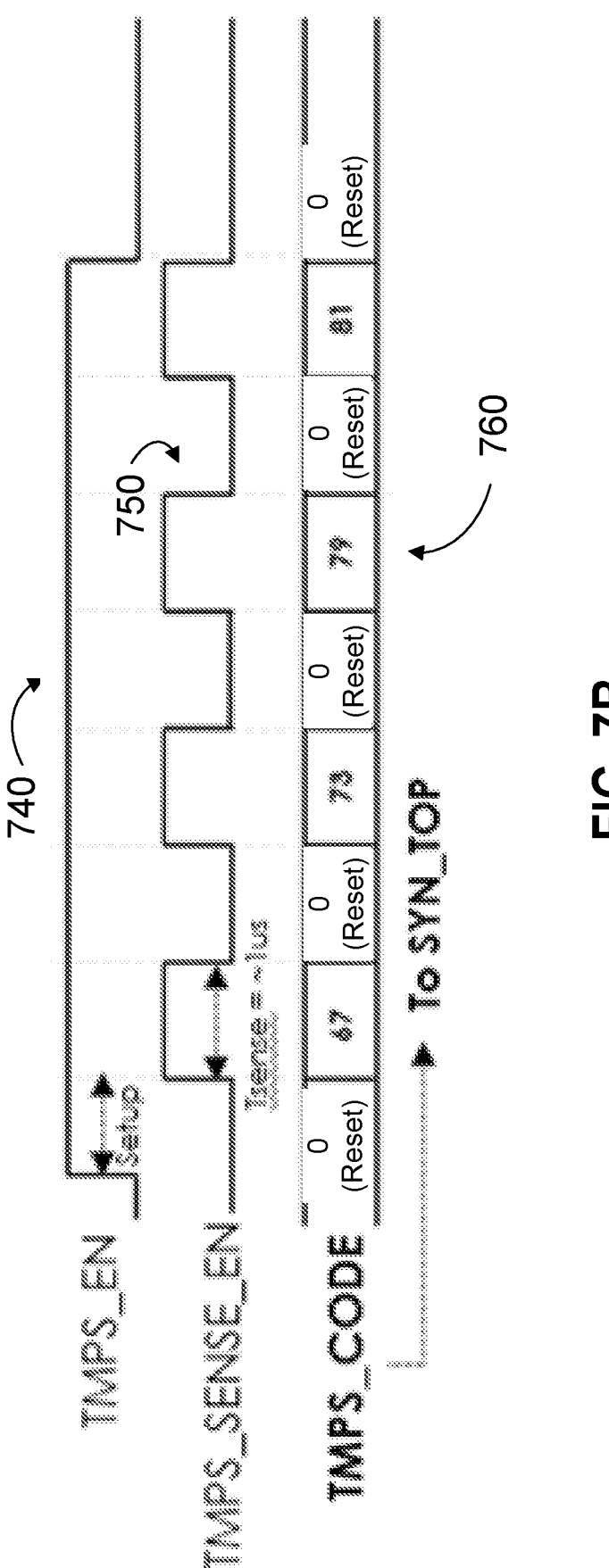

FIGS. 7A and 7B depict example graphs illustrating various parameters of a memory die during a wordline ramp up process, in accordance with embodiments of the present technology.

In particular, graph 710 depicts voltage of a wordline ramp up pump (e.g., wordline ramp up pump 604) as a function of time during a wordline ramp process. As depicted, a typical wordline ramp up process may occur over a span of approximately 6 microseconds (μs).

Graph 720 depicts ICC drawn/consumed by the wordline ramp up pump as a function of time during the wordline ramp process. In the specific example of FIG. 7A, the maximum ICC drawn/consumed during the wordline ramp process is approximately 130 milliamps (mA).

Graph 730 depicts temperature of a substrate region of the memory die located proximate to the wordline ramp up pump as a function of time during the wordline ramp process. As can be seen, there is an approximate linear relationship between the ICC drawn/consumed by the wordline ramp up pump and the temperature of the substrate region during the wordline ramp process. Again, embodiments of the present technology leverage this close/linear relationship to effectively estimate the ICC drawn/consumed by the wordline ramp up pump based on measured temperature rise for the substrate region.

As will be described in greater detail in conjunction with FIG. 8, embodiments can use a calibration process to relate a measured temperature rise to a value of ICC drawn/consumed during the wordline ramp up process.

Graph 740 depicts temperature sensor enablement as a function of time during the wordline ramp process. As depicted, a temperature sensor may be enabled immediately prior to the wordline ramp process, and disabled immediately afterwards. By limiting temperature sensor enablement to the approximate time interval of the wordline ramp process, embodiments can reduce power consumption for the memory die.

Graph 750 depicts temperature sensing as a function of time during the wordline ramp process. As depicted, the temperature sensor may acquire temperature data in periodic intervals of approximately 1 μs. Temperature data that is continuously measured/acquired can be difficult to interpret after it is converted into digital code. For this reason, in various embodiments the temperature data may be acquired in the periodic 1 μs time intervals. As depicted, it can take the temperature sensor approximately 1 μs to convert acquired temperature data to digital code, thus the approximately 1 μs intervals between temperature sensing intervals.

Graph 760 depicts digital code derived from the temperature data acquired from the temperature sensor. Such digital code can be sent from the temperature sensor to a processor of the memory die. As alluded to above, the processor can use the digital code to: (1) estimate a temperature rise for the substrate region during the wordline ramp up process; (2) determine that an ICC peak of the memory die deviates from a target ICC peak value based on the estimated temperature rise; and (3) adjust parameters of the wordline ramp up process based on the determination.

Figure 8:
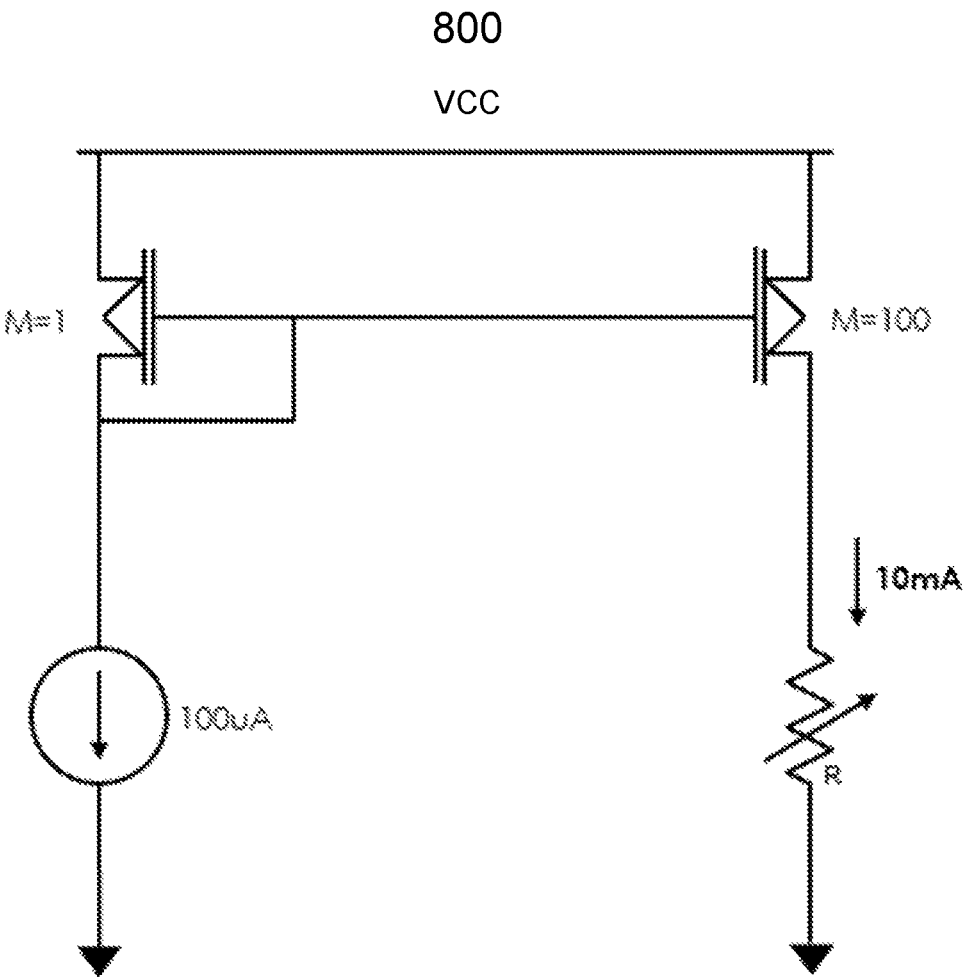
FIG. 8 depicts an example calibration circuit, in accordance with embodiments of the present technology.

FIG. 8 depicts an example calibration circuit 800, in accordance with embodiments of the present technology. Calibration circuit 800 may be implemented on a memory die.

As alluded to above, embodiments can use a calibration process to relate a measured temperature rise for a substrate region located proximate to a wordline ramp up pump to a value of ICC drawn/consumed during the wordline ramp up process. The calibration process may involve estimating a temperature-to-current coefficient for the substrate region by measuring a calibration temperature rise for the substrate region when a known current is applied through the substrate region. The temperature-to-current coefficient may relate temperature rise to electrical current rise. A calibration circuit such as calibration circuit 800 may be used for this process.

For example, a known current (e.g., 10 mA) may be dumped from a voltage supply line of the memory die to ground through the substrate region. A temperature rise (e.g., 6° C.) may be measured for the substrate region during this process. Accordingly, a processor of the memory die can compute a temperature-to-current coefficient for the substrate region based on the known current and measured temperature rise. Again, the temperature-to-current coefficient may relate temperature rise to electrical current rise. The processor may then use this temperature-to-current coefficient to determine that an ICC peak of the memory die deviates from a target ICC peak value based on an estimated temperature rise of the substrate during a wordline ramp up process.

Here, a relatively small value for the known current (e.g., approximately 10 times smaller than a target ICC peak value) may be used to minimize footprint for the calibration circuit—thereby reducing costs/footprint for the memory die.

Figure 9:
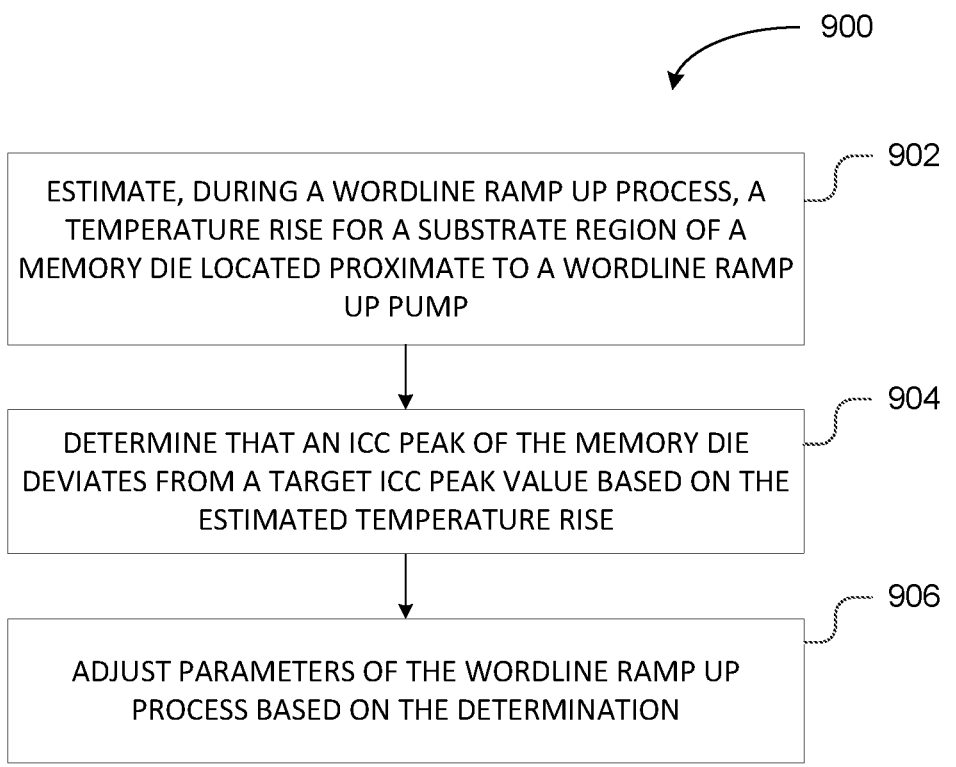
FIG. 9 depicts an example process for determining that an ICC peak of a memory die deviates from a target ICC peak value based on an estimated temperature rise, in accordance with embodiments of the present technology.

FIG. 9 depicts an example process 900 for determining that an ICC peak of a memory die deviates from a target ICC peak value based on an estimated temperature rise, in accordance with embodiments of the present technology. As depicted, example process 900 includes instructions 902-906. Instructions 902-906 may be executed by a processor of a memory die—such as die controller 204 described in conjunction with FIG. 2A.

For example, the processor can execute instruction 902 to estimate, during a wordline ramp up process, a temperature rise for a substrate region of a memory die located proximate to a wordline ramp up pump that drives the wordline ramp up process.

As alluded to above, this may comprise using a temperature sensor to estimate a minimum and maximum temperature of the substrate region during the wordline ramp up process. In order to reduce power consumption, the processor may enable the temperature sensor immediately prior to the wordline ramp up process and disable the temperature sensor immediately after the wordline ramp up process.

The processor can execute instruction 904 to determine that a peak source current (ICC peak) of the memory die deviates from (i.e., is greater than or less than) a target ICC peak value based on the estimated temperature rise. As alluded to above, the processor can leverage a couple important insights to make this determination. First, in many cases the (overall) ICC peak for the memory die will be the maximum ICC drawn/consumed by the wordline ramp up pump during the wordline ramp up process. Moreover, even when an actual ICC peak for the memory die is drawn/consumed during a different process (e.g., during a read operation involving a large number of conducting memory cells), the maximum ICC value drawn/consumed by the wordline ramp up pump during the wordline ramp up process will serve as a close approximation of the actual ICC peak. Second, as embodiments are designed in appreciation of, temperature rise of the substrate region located proximate to the wordline ramp up pump can closely correlate with a rise in the ICC drawn/consumed by the wordline ramp up pump during the wordline ramp up process. The processor can leverage these insights to effectively estimate ICC peak for the memory die based on the temperature rise for the substrate region during the wordline ramp up process.

In some examples, the processor can use an estimated temperature-to-current coefficient for the substrate region to determine that the ICC peak of the memory die deviates from the target ICC peak value based on the estimated temperature rise. The estimated temperature-to-current coefficient can relate temperature rise to electrical current rise. The processor can estimate the temperature-to-current coefficient by estimating a calibration temperature rise for the substrate region when a known electrical current is applied through the substrate region.

The processor can execute instruction 906 to adjust parameters of the wordline ramp up process based on the determination made at instruction 904. This may comprise: (a) in response to determining that the ICC peak exceeds the target ICC peak value, reducing a ramp up rate of the wordline ramp up pump; and (b) in response to determining that the ICC peak is less than the target ICC peak value, increasing the ramp up rate of the wordline ramp up pump.

In various embodiments, the processor may determine a magnitude of deviation between the ICC peak and the target ICC peak. Accordingly, the processor can adjust parameters of the wordline ramp up process based on the determined magnitude of deviation between the ICC peak and the target ICC peak. For example, the processor may increase the ramp up rate of the wordline ramp up pump by a greater magnitude when there is a relatively larger deviation between ICC peak and the target ICC peak.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (Saas). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method comprising:
estimating, during a wordline ramp up process, a temperature rise for a substrate region of a memory die located proximate to a wordline ramp up pump that drives the wordline ramp up process;
calculating a peak source current (ICC peak) of the memory die by applying a temperature-to-current coefficient for the substrate region to the estimated temperature rise;

determining that the ICC peak deviates from a target ICC peak value; and
adjusting parameters of the wordline ramp up process based on the determination.

2. The method of claim 1, wherein adjusting the parameters of the wordline ramp up process based on the determination comprises:
in response to determining the ICC peak exceeds the target ICC peak value, reducing a ramp up rate of the wordline ramp up pump; and
in response to determining the ICC peak is less than the target ICC peak value, increasing the ramp up rate of the wordline ramp up pump.

3. The method of claim 1, further comprising:
estimating the temperature-to-current coefficient for the substrate region by estimating a calibration temperature rise for the substrate region when a known current is applied through the substrate region.

4. The method of claim 1, wherein estimating the temperature rise comprises:
using a temperature sensor to estimate a minimum and maximum temperature of the substrate region during the wordline ramp up process.

5. The method of claim 4, further comprising:
enabling the temperature sensor prior to the wordline ramp up process; and
disabling the temperature sensor after the wordline ramp up process.

6. The method of claim 1, wherein the wordline ramp up process is performed before a read operation.

7. The method of claim 1, wherein a maximum current consumed by the wordline ramp up pump during the wordline ramp up process approximates the ICC peak.

8. A memory die, comprising:
a wordline ramp up pump that drives a wordline ramp up process; and
a processor operative to:
estimate, during the wordline ramp up process, a temperature rise for a substrate region of the memory die located proximate to the wordline ramp up pump from two or more temperature measurements by a temperature sensor in the substrate region;
determine that a peak source current (ICC peak) of the memory die deviates from a target ICC peak value based on applying a temperature-to-current coefficient for the substrate region to the estimated temperature rise; and
adjust parameters of the wordline ramp up process based on the determination.

9. The memory die of claim 8, wherein adjusting the parameters of the wordline ramp up process based on the determination comprises:
in response to determining the ICC peak exceeds the target ICC peak value, reducing a ramp up rate of the wordline ramp up pump; and
in response to determining the ICC peak is less than the target ICC peak value, increasing the ramp up rate of the wordline ramp up pump.

10. The memory die of claim 8, wherein the processor is further operative to:
Estimate the temperature-to-current coefficient for the substrate region by estimating a calibration temperature rise for the substrate region when a known current is applied through the substrate region.

11. The memory die of claim 8, further comprising a temperature sensor located at the substrate region, wherein estimating the temperature rise comprises:

using the temperature sensor to estimate a minimum and maximum temperature of the substrate region during the wordline ramp up process.

12. The memory die of claim 11, wherein the processor is further operative to:

enable the temperature sensor prior to the wordline ramp up process; and disable the temperature sensor after the wordline ramp up process.

13. The memory die of claim 8, wherein the wordline ramp up process is performed before a read operation.

14. The memory die of claim 8, wherein a maximum current consumed by the wordline ramp up pump during the wordline ramp up process approximates the ICC peak.

15. A memory die comprising:

a wordline ramp up pump that drives a wordline ramp up process; and a processor operative to:

estimate, during the wordline ramp up process, a temperature rise for a substrate region of the memory die located proximate to the wordline ramp up pump;

in response to determining a peak source current (ICC peak) of the memory die exceeds a target ICC peak value based on applying a temperature-to-current coefficient for the substrate region to the estimated temperature rise, reduce a ramp rate of the wordline ramp up pump; and in response to determining the ICC peak is less than the target ICC peak value based on applying the temperature-to-current coefficient for the substrate region to the estimated temperature rise, increase the ramp rate of the wordline ramp up pump.

16. The memory die of claim 15, wherein the processor is further operative to:

estimate the temperature-to-current coefficient for the substrate region by estimating a calibration temperature rise for the substrate region when a known current is applied through the substrate region.

17. The memory die of claim 15, further comprising a temperature sensor located at the substrate region, wherein estimating the temperature rise comprises:

using the temperature sensor to estimate a minimum and maximum temperature of the substrate region during the wordline ramp up process.

18. The memory die of claim 17, wherein the processor is further operative to:

enable the temperature sensor prior to the wordline ramp up process; and disable the temperature sensor after the wordline ramp up process.

19. The memory die of claim 15, wherein the wordline ramp up process is performed before a read operation.

20. The memory die of claim 15, wherein a maximum current consumed by the wordline ramp up pump during the wordline ramp up process approximates the ICC peak.

* * * * *